US008117436B2

(12) United States Patent
Zhang et al.

(10) Patent No.: US 8,117,436 B2
(45) Date of Patent: Feb. 14, 2012

(54) HYBRID NANOTUBE/CMOS DYNAMICALLY RECONFIGURABLE ARCHITECTURE AND AN INTEGRATED DESIGN OPTIMIZATION METHOD AND SYSTEM THEREFOR

(75) Inventors: Wei Zhang, Princeton, NJ (US); Niraj K. Jha, Westfield, NJ (US); Li Shang, Boulder, CO (US)

(73) Assignees: Queen's University at Kingston, ON (CA); Trustees of Princeton University, Princeton, NJ (US)

( * ) Notice: Subject to any disclaimer, the term of this patent is extended or adjusted under 35 U.S.C. 154(b) by 0 days.

(21) Appl. No.: 12/297,638

(22) PCT Filed: Apr. 19, 2007

(86) PCT No.: PCT/US2007/009658
§ 371 (c)(1),
(2), (4) Date: Apr. 9, 2009

(87) PCT Pub. No.: WO2007/124048
PCT Pub. Date: Nov. 1, 2007

(65) Prior Publication Data
US 2009/0219051 A1    Sep. 3, 2009

Related U.S. Application Data

(60) Provisional application No. 60/793,665, filed on Apr. 19, 2006, provisional application No. 60/919,225, filed on Mar. 21, 2007.

(51) Int. Cl.
*G06F 1/24* (2006.01)
(52) U.S. Cl. ........................................ 713/100; 712/229
(58) Field of Classification Search .................. 713/1, 2, 713/100; 712/229
See application file for complete search history.

(56) References Cited

U.S. PATENT DOCUMENTS
4,987,319 A    1/1991    Kawana
5,399,922 A    3/1995    Kiani et al.
(Continued)

FOREIGN PATENT DOCUMENTS
WO    2009002600 A1    12/2008
(Continued)

OTHER PUBLICATIONS

Rueckes, et al., "Carbon Nanotube Based Non-Volatile random Access Memory for Molecular Computing", Science, vol. 289, pp. 94-97, Jul. 7, 2000.
(Continued)

*Primary Examiner* — Don P Le

(57) ABSTRACT

A hybrid nanotube, high-performance, dynamically reconfigurable architecture, NATURE, is provided, and a design optimization flow method and system, NanoMap. A run-time reconfigurable architecture is provided by associating a non-volatile universal memory to each logic element to enable cycle-by-cycle reconfiguration and logic folding, while remaining CMOS compatible. Through logic folding, significant logic density improvement and flexibility in performing area-delay tradeoffs are possible. NanoMap incorporates temporal logic folding during the logic mapping, temporal clustering and placement steps. NanoMap provides for automatic selection of a best folding level, and uses force-direct scheduling to balance resources across folding stages. Mapping can thereby target various optimization objectives and user constraints. A high-density, high-speed carbon nanotube RAM can be implemented as the universal memory, allowing on-chip multi-context configuration storage, enabling fine-grain temporal logic folding, and providing a significant increase in relative logic density.

30 Claims, 25 Drawing Sheets

U.S. PATENT DOCUMENTS

| | | |
|---|---|---|
| 5,448,496 A | 9/1995 | Butts et al. |
| 5,539,331 A | 7/1996 | Hatori et al. |
| 5,914,616 A | 6/1999 | Young et al. |
| 6,009,531 A | 12/1999 | Selvidge et al. |
| 6,249,143 B1 | 6/2001 | Zaveri et al. |
| 6,924,663 B2 | 8/2005 | Masui et al. |
| 7,109,752 B1 | 9/2006 | Schmit et al. |
| 7,126,381 B1 | 10/2006 | Schmit et al. |
| 7,145,361 B1 | 12/2006 | Rohe et al. |
| 7,157,933 B1 | 1/2007 | Schmit et al. |
| 7,174,443 B1 * | 2/2007 | Vorbach et al. ............... 712/229 |
| 7,193,440 B1 | 3/2007 | Schmit et al. |
| 7,224,181 B1 | 5/2007 | Schmit et al. |
| 7,224,182 B1 | 5/2007 | Hutchings et al. |
| 7,230,869 B1 | 6/2007 | Redgrave et al. |
| 7,236,009 B1 | 6/2007 | Rohe et al. |
| 7,242,216 B1 | 7/2007 | Schmit et al. |
| 7,259,587 B1 | 8/2007 | Schmit et al. |
| 7,262,633 B1 | 8/2007 | Schmit et al. |
| 7,268,586 B1 | 9/2007 | Redgrave |
| 7,272,031 B1 | 9/2007 | Redgrave |
| 7,276,933 B1 | 10/2007 | Teig et al. |
| 7,301,242 B2 | 11/2007 | Teig |
| 7,301,368 B2 | 11/2007 | Schmit et al. |
| 7,310,003 B2 | 12/2007 | Hutchings et al. |
| 7,312,630 B2 | 12/2007 | Rohe et al. |
| 7,317,331 B2 | 1/2008 | Teig et al. |
| 7,372,297 B1 | 5/2008 | Pugh et al. |
| 7,420,389 B2 | 9/2008 | Schmit et al. |
| 7,449,915 B2 | 11/2008 | Schmit et al. |
| 7,461,362 B1 | 12/2008 | Caldwell et al. |
| 7,468,614 B2 | 12/2008 | Rohe et al. |
| 7,489,162 B1 | 2/2009 | Schmit et al. |
| 7,492,186 B2 | 2/2009 | Hutchings et al. |
| 7,496,879 B2 | 2/2009 | Rohe et al. |
| 7,504,858 B1 | 3/2009 | Schmit et al. |
| 7,512,850 B2 | 3/2009 | Redgrave et al. |
| 7,514,957 B2 | 4/2009 | Schmit et al. |
| 7,518,400 B1 | 4/2009 | Redgrave et al. |
| 7,518,402 B2 | 4/2009 | Schmit et al. |
| 7,521,958 B2 | 4/2009 | Hutchings et al. |
| 7,521,959 B2 | 4/2009 | Teig |
| 7,525,342 B2 | 4/2009 | Teig et al. |
| 7,525,344 B2 | 4/2009 | Teig et al. |
| 7,525,835 B2 | 4/2009 | Redgrave |
| 7,528,627 B2 | 5/2009 | Redgrave et al. |
| 7,529,992 B1 | 5/2009 | Teig et al. |
| 7,530,033 B2 | 5/2009 | Caldwell et al. |
| 7,532,030 B2 | 5/2009 | Redgrave |
| 7,532,032 B2 | 5/2009 | Schmit et al. |
| 7,535,252 B1 | 5/2009 | Teig et al. |
| 7,545,167 B2 | 6/2009 | Teig et al. |
| 7,548,085 B2 | 6/2009 | Hutchings et al. |
| 7,548,090 B2 | 6/2009 | Redgrave et al. |
| 7,550,991 B2 | 6/2009 | Redgrave et al. |
| 7,557,609 B2 | 7/2009 | Rohe et al. |
| 7,564,260 B1 | 7/2009 | Schmit et al. |
| 7,564,261 B2 | 7/2009 | Schmit et al. |
| 7,565,525 B2 * | 7/2009 | Vorbach et al. ............... 713/100 |
| 7,570,077 B2 | 8/2009 | Redgrave |
| 7,573,296 B2 | 8/2009 | Schmit et al. |
| 7,576,564 B2 | 8/2009 | Schmit et al. |
| 7,587,697 B1 | 9/2009 | Schmit et al. |
| 7,587,698 B1 | 9/2009 | Rohe et al. |
| 7,595,655 B2 | 9/2009 | Hutchings et al. |
| 7,609,085 B1 | 10/2009 | Schmit et al. |
| 7,610,566 B1 | 10/2009 | Caldwell et al. |
| 7,616,027 B2 | 11/2009 | Schmit et al. |
| 7,622,951 B2 | 11/2009 | Schmit et al. |
| 7,626,419 B1 | 12/2009 | Schmit et al. |
| 7,652,498 B2 | 1/2010 | Hutchings et al. |
| 7,652,499 B2 | 1/2010 | Schmit et al. |
| 7,656,188 B2 | 2/2010 | Teig et al. |
| 7,667,486 B2 | 2/2010 | Schmit et al. |
| 7,669,097 B1 | 2/2010 | Teig et al. |
| 7,669,168 B1 * | 2/2010 | Patterson ............... 716/19 |
| 7,679,401 B1 | 3/2010 | Redgrave |
| 7,694,083 B1 | 4/2010 | Schmit et al. |
| 7,694,265 B2 | 4/2010 | Rohe et al. |
| 7,696,780 B2 | 4/2010 | Hutchings et al. |
| 7,728,617 B2 | 6/2010 | Redgrave et al. |
| 7,737,722 B2 | 6/2010 | Rohe et al. |
| 7,743,085 B2 | 6/2010 | Schmit et al. |
| 7,788,478 B2 | 8/2010 | Redgrave et al. |
| 7,797,497 B1 | 9/2010 | Schmit et al. |
| 7,804,730 B2 | 9/2010 | Redgrave et al. |
| 7,816,944 B2 | 10/2010 | Hutchings |
| 7,825,685 B2 | 11/2010 | Chandler et al. |
| 7,825,687 B2 | 11/2010 | Redgrave |
| 7,839,162 B2 | 11/2010 | Hutchings |
| 7,839,166 B2 | 11/2010 | Schmit et al. |
| 7,849,434 B2 | 12/2010 | Rohe et al. |
| 7,870,529 B2 | 1/2011 | Rohe et al. |
| 7,870,530 B2 | 1/2011 | Rohe et al. |
| 7,872,496 B2 | 1/2011 | Schmit et al. |
| 7,898,291 B2 | 3/2011 | Rohe et al. |
| 2007/0241775 A1 | 10/2007 | Redgrave |
| 2007/0241781 A1 | 10/2007 | Hutchings |
| 2007/0241783 A1 | 10/2007 | Schmit et al. |
| 2007/0241785 A1 | 10/2007 | Schmit et al. |
| 2007/0244957 A1 | 10/2007 | Redgrave |
| 2007/0244958 A1 | 10/2007 | Redgrave |
| 2007/0244959 A1 | 10/2007 | Teig et al. |
| 2007/0245270 A1 | 10/2007 | Teig |
| 2007/0245287 A1 | 10/2007 | Rohe et al. |
| 2007/0245288 A1 | 10/2007 | Rohe et al. |
| 2007/0257700 A1 | 11/2007 | Caldwell et al. |
| 2008/0224730 A1 | 9/2008 | Redgrave et al. |
| 2009/0002020 A1 | 1/2009 | Hutchings et al. |
| 2009/0002021 A1 | 1/2009 | Hutchings et al. |
| 2009/0002024 A1 | 1/2009 | Hutchings et al. |
| 2009/0007027 A1 | 1/2009 | Hutchings et al. |
| 2009/0146686 A1 | 6/2009 | Voogel et al. |
| 2009/0167345 A1 | 7/2009 | Voogel et al. |
| 2009/0327987 A1 | 12/2009 | Teig et al. |
| 2010/0001759 A1 | 1/2010 | Teig et al. |
| 2010/0070671 A1 * | 3/2010 | Vorbach et al. ............... 710/305 |
| 2011/0060546 A1 | 3/2011 | Miller et al. |
| 2011/0068820 A1 | 3/2011 | Fox |

FOREIGN PATENT DOCUMENTS

| | | |
|---|---|---|
| WO | 2009035586 A1 | 3/2009 |
| WO | 2009039462 A1 | 3/2009 |
| WO | 2009131569 A1 | 10/2009 |
| WO | 2009151934 A1 | 12/2009 |
| WO | 2010016857 A1 | 2/2010 |
| WO | 2010033263 A1 | 3/2010 |
| WO | 2010053590 A1 | 5/2010 |
| WO | 2011035076 A1 | 3/2011 |

OTHER PUBLICATIONS

International Search Report from PCT/US07/09658 dated May 2, 2008.

Written Opinion from PCT/US07/09658 dated May 2, 2008.

Ward, et al., "A Non-Volatile Nanoelectromechanical Memory Element Utilizing a Fabric of Carbon Nanotubes", Nantero, Inc., Woburn, MA, (c) 2004 IEEE, p. 34-38.

Lai, "Current Status of the Phase Change Memory and its Future", Intel Corporation, Santa Clara, CA, Dec. 2003, 4 pages.

Tehrani, et al., "Magnetoresistive Random Access Memory Using Magnetic Tunnel Junctions", Proceedings of the IEEE, vol. 91, No. 5, May 2003, p. 703-714.

Fox, et al., "Current and Future Ferroelectric Nonvolatile Memory Technology", J. Vac. Sci. Technol. B 19(5), Sep./Oct. 2001, p. 1967-1971.

Zhang, et al., "Nature: A Hybrid Nanotube/CMOS Dynamically Reconfigurable Architecture", 30 pages.

Zhang, et al., "Nature: A Hybrid Nanotube/CMOS Dynamically Reconfigurable Architecture", IEEE Design Automation Conference, Jul. 2006, 30 pages.

* cited by examiner

TABLE I

CIRCUIT MAPPING RESULTS

| Circuit | LUT graph depth | Level-1 folding | | | | Level-2 folding | | | |
|---|---|---|---|---|---|---|---|---|---|
| | | LEs | Delay (ns) | LEs x Delay | Freq. (GHz) | LEs | Delay (ns) | LEs x Delay | Freq. (GHz) |
| pm1 | 3 | 9 | 1.08 | 9.72 | 2.78 | 11 | 1.00 | 11.00 | 2.00 |
| sct | 4 | 9 | 1.64 | 14.76 | 2.86 | 16 | 1.10 | 17.60 | 1.82 |
| cm163a | 4 | 4 | 1.40 | 5.60 | 2.86 | 8 | 1.10 | 8.80 | 1.82 |
| z4ml | 5 | 2 | 1.75 | 3.5 | 2.86 | 3 | 1.47 | 4.41 | 2.04 |
| cc | 5 | 13 | 2.05 | 26.65 | 2.44 | 14 | 2.03 | 28.35 | 1.48 |
| poler8 | 7 | 9 | 2.87 | 25.83 | 2.44 | 10 | 2.20 | 22.0 | 1.82 |
| cordic | 7 | 7 | 2.87 | 20.09 | 2.44 | 12 | 2.20 | 26.40 | 1.82 |
| lal | 7 | 24 | 2.52 | 60.48 | 2.78 | 32 | 2.00 | 64.00 | 2.00 |
| ldd | 7 | 10 | 2.94 | 29.40 | 2.38 | 17 | 2.48 | 42.16 | 1.61 |
| 9symml | 18 | 10 | 10.36 | 103.60 | 1.72 | 30 | 7.45 | 223.50 | 1.20 |
| alu2 | 31 | 12 | 12.71 | 152.52 | 2.68 | 24 | 11.76 | 282.24 | 1.36 |
| 16-bit ripple-carry adder | 16 | 2 | 4.80 | 9.60 | 3.33 | 4 | 3.52 | 14.08 | 2.27 |
| 32-bit ripple-carry adder | 32 | 2 | 9.60 | 19.20 | 3.33 | 4 | 7.04 | 28.16 | 2.27 |
| 64-bit ripple-carry adder | 64 | 2 | 19.20 | 38.40 | 3.33 | 4 | 14.08 | 56.32 | 2.27 |
| 16-bit carry-lookahead adder | 10 | 13 | 3.60 | 46.80 | 2.78 | 26 | 3.43 | 89.13 | 1.46 |
| 32-bit carry-lookahead adder | 18 | 13 | 6.48 | 84.24 | 2.78 | 26 | 6.17 | 160.42 | 1.46 |
| 64-bit carry-lookahead adder | 34 | 13 | 12.24 | 159.12 | 2.78 | 26 | 11.65 | 302.90 | 1.46 |
| 16-bit carry-select adder | 8 | 30 | 2.88 | 86.4 | 2.78 | 55 | 2.76 | 151.80 | 1.46 |
| 32-bit carry-select adder | 14 | 30 | 5.04 | 150.12 | 2.78 | 55 | 4.80 | 264.00 | 1.46 |
| 64-bit carry-select adder | 26 | 30 | 9.36 | 280.80 | 2.78 | 55 | 8.91 | 490.05 | 1.46 |
| 8-bit multiplier | 8 | 16 | 3.88 | 62.08 | 2.06 | 32 | 3.24 | 103.68 | 1.23 |
| 16-bit multiplier | 16 | 32 | 7.76 | 248.32 | 2.06 | 64 | 6.48 | 414.72 | 1.23 |
| 32-bit multiplier | 32 | 64 | 15.52 | 993.28 | 2.06 | 128 | 12.96 | 1658.88 | 1.23 |

| Circuit | LUT graph depth | Level-4 folding | | | | No folding | | | |
|---|---|---|---|---|---|---|---|---|---|
| | | LEs | Delay (ns) | LEs x Delay | Freq. (GHz) | LEs | Delay (ns) | LEs x Delay | Freq. (GHz) |
| pm1 | 3 | 22 | 0.61 | 13.42 | 1.64 | 22 | 0.61 | 13.42 | 1.64 |
| sct | 4 | 32 | 0.62 | 19.84 | 1.61 | 32 | 0.62 | 19.84 | 1.61 |
| cm163a | 4 | 14 | 0.59 | 8.26 | 1.69 | 14 | 0.59 | 8.26 | 1.69 |
| z4ml | 5 | 5 | 1.25 | 6.25 | 1.60 | 9 | 0.73 | 6.57 | 1.37 |
| cc | 5 | 24 | 1.91 | 45.84 | 1.05 | 28 | 1.14 | 31.78 | 0.88 |
| poler8 | 7 | 16 | 1.54 | 24.64 | 1.30 | 35 | 1.01 | 35.35 | 0.99 |
| cordic | 7 | 14 | 1.60 | 22.40 | 1.25 | 28 | 1.07 | 29.96 | 0.93 |
| lal | 7 | 56 | 1.56 | 87.36 | 2.56 | 73 | 1.07 | 78.11 | 0.93 |
| ldd | 7 | 31 | 2.05 | 63.55 | 0.98 | 44 | 1.38 | 60.72 | 0.72 |
| 9symml | 18 | 54 | 6.85 | 369.90 | 0.73 | 124 | 3.83 | 474.92 | 0.26 |
| alu2 | 31 | 44 | 9.36 | 411.84 | 0.85 | 211 | 6.14 | 1295.54 | 0.16 |
| 16-bit ripple-carry adder | 16 | 8 | 2.88 | 23.04 | 1.39 | 32 | 2.39 | 76.48 | 0.42 |
| 32-bit ripple-carry adder | 32 | 8 | 5.76 | 46.08 | 1.39 | 64 | 5.00 | 320.00 | 0.20 |
| 64-bit ripple-carry adder | 64 | 8 | 11.52 | 92.16 | 1.39 | 128 | 10.21 | 1306.88 | 0.10 |
| 16-bit carry-lookahead adder | 10 | 52 | 3.63 | 163.35 | 0.83 | 104 | 2.35 | 244.40 | 0.43 |
| 32-bit carry-lookahead adder | 18 | 52 | 6.05 | 272.25 | 0.83 | 208 | 4.45 | 925.60 | 0.23 |
| 64-bit carry-lookahead adder | 34 | 52 | 10.89 | 490.05 | 0.83 | 416 | 8.65 | 3598.4 | 0.12 |
| 16-bit carry-select adder | 8 | 93 | 2.42 | 225.06 | 0.83 | 134 | 2.21 | 296.14 | 0.45 |
| 32-bit carry-select adder | 14 | 93 | 4.84 | 450.12 | 0.83 | 268 | 4.31 | 1155.08 | 0.23 |
| 64-bit carry-select adder | 26 | 93 | 8.47 | 787.71 | 0.83 | 536 | 8.51 | 4561.36 | 0.12 |
| 8-bit multiplier | 8 | 64 | 2.92 | 186.88 | 0.68 | 128 | 2.39 | 305.92 | 0.42 |
| 16-bit multiplier | 16 | 128 | 5.84 | 747.52 | 0.68 | 512 | 4.98 | 2549.76 | 0.20 |
| 32-bit multiplier | 32 | 256 | 11.68 | 2990.08 | 0.68 | 2048 | 9.54 | 19537.92 | 0.10 |

FIG. 8

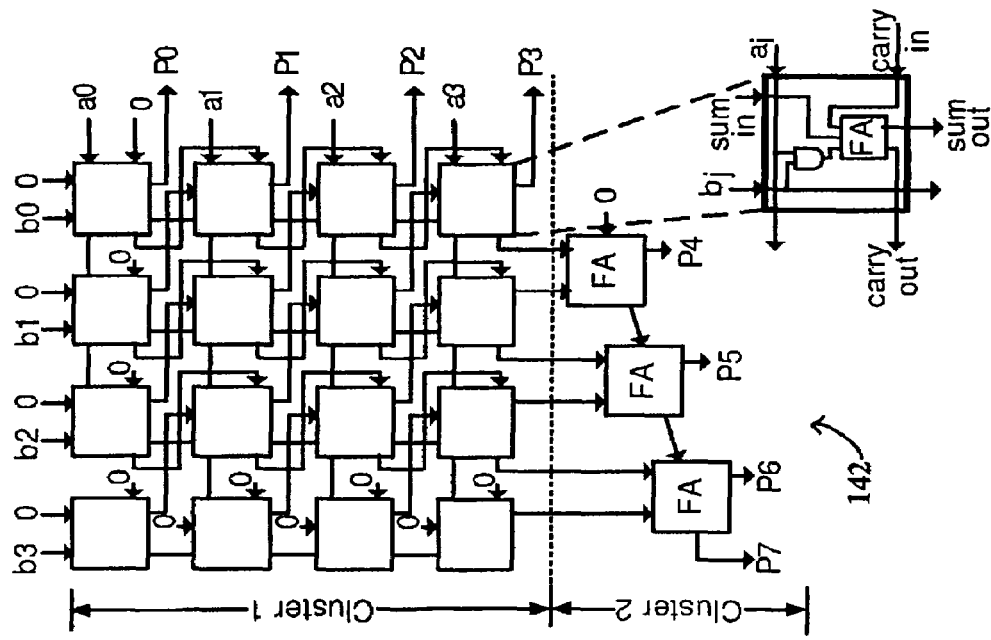
FIG. 18B
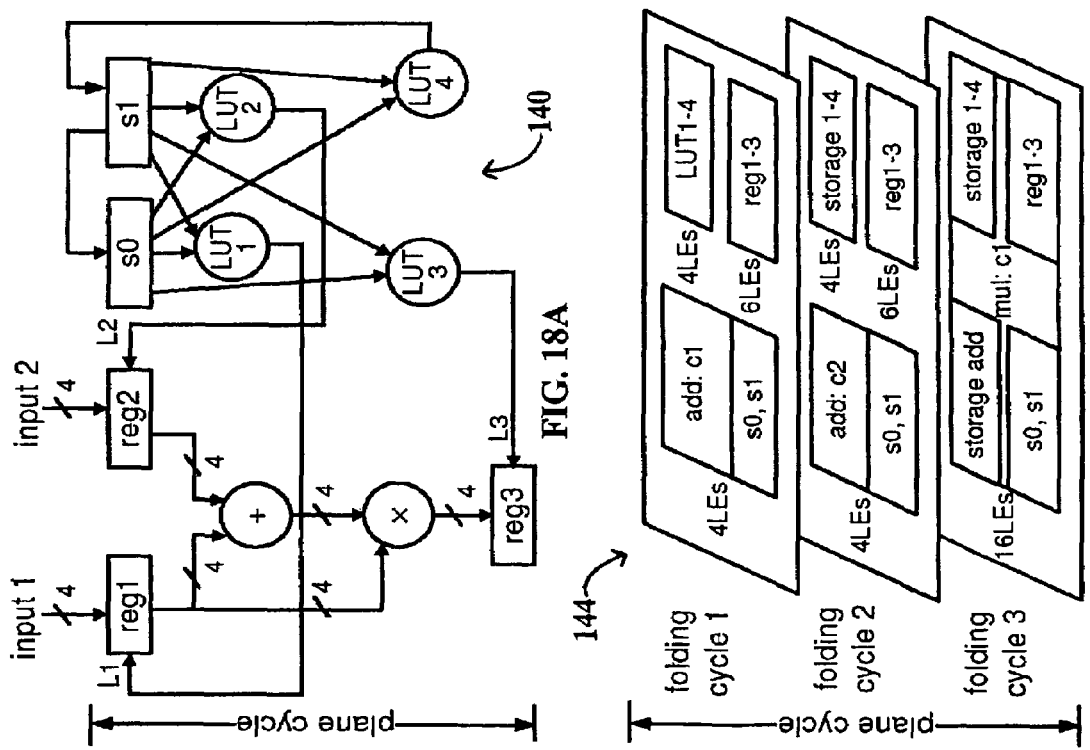
FIG. 18A
FIG. 18C

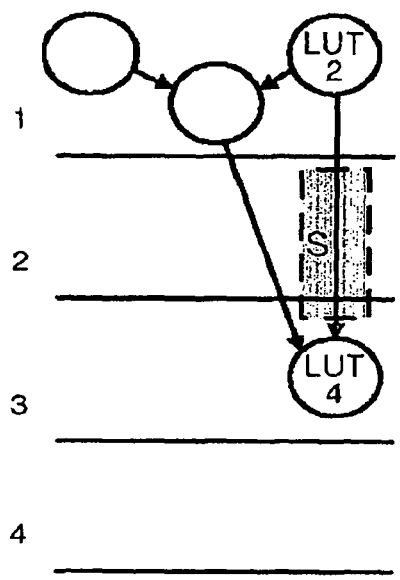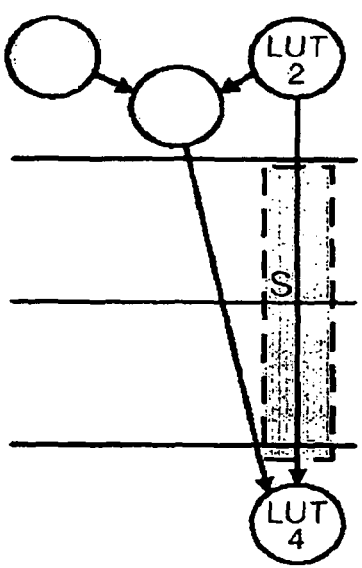
FIG. 22A   FIG. 22B   FIG. 22C

TABLE II

CIRCUIT MAPPING RESULTS FOR AT PRODUCT OPTIMIZATION

| Circuit | # Planes | Max plane depth | #LUTs | #Flip flops | No folding | | AT optimization (k enough) | | | | AT optimization (k = 16) | | | |
|---|---|---|---|---|---|---|---|---|---|---|---|---|---|---|
| | | | | | #LEs | Delay (ns) | #LEs | Folding level | Delay (ns) | AT Improv. | #LEs | Folding level | Delay (ns) | AT Improv. |
| ex1 | 1 | 24 | 644 | 50 | 644 | 12.90 | 34 | 1 | 17.02 | 14.36X | 68 | 2 | 15.60 | 7.83X |
| FIR | 1 | 25 | 678 | 112 | 678 | 14.20 | 56 | 3 | 18.50 | 9.29X | 72 | 2 | 16.90 | 7.91X |
| ex2 | 3 | 22 | 694 | 130 | 694 | 38.76 | 67 | 11 | 48.84 | 8.22X | 88 | 2 | 42.90 | 7.13X |
| c5315 | 1 | 14 | 792 | 0 | 792 | 7.86 | 144 | 1 | 10.36 | 4.17X | 144 | 1 | 10.36 | 4.17X |
| Biquad | 1 | 22 | 1376 | 64 | 1376 | 12.34 | 68 | 1 | 16.28 | 15.34X | 136 | 2 | 14.30 | 8.73X |
| Paulin | 2 | 24 | 1468 | 147 | 1468 | 26.74 | 106 | 3 | 35.52 | 10.43X | 136 | 2 | 31.20 | 9.25X |
| ASPP4 | 2 | 24 | 2240 | 160 | 2240 | 26.80 | 100 | 6 | 36.96 | 16.24X | 200 | 2 | 32.40 | 9.26X |

TABLE III

CIRCUIT MAPPING RESULTS FOR TYPICAL OPTIMIZATION

| Circuit | Optimization | Area const. (#LEs) | Delay const. (ns) | Folding level | #LEs | Delay (ns) |
|---|---|---|---|---|---|---|
| ex1 | Delay | - | - | 1 | 34 | 17.02 |
| FIR | Delay | 110 | - | 3 | 108 | 16.74 |
| ex2 | Area | - | 40 | 11 | 352 | 38.04 |
| c5315 | Area | - | - | 1 | 144 | 10.36 |
| Biquad | Delay | 100 | - | 1 | 68 | 16.28 |
| Paulin | - | 210 | 30 | 3 | 204 | 29.76 |
| ASPP4 | Area | - | 28.5 | 6 | 600 | 28.32 |

FIG. 25

HYBRID NANOTUBE/CMOS DYNAMICALLY RECONFIGURABLE ARCHITECTURE AND AN INTEGRATED DESIGN OPTIMIZATION METHOD AND SYSTEM THEREFOR

RELATED APPLICATIONS

This application is a 371 application of International Application No. PCT/US2007/009658 filed Apr. 19, 2007, which claims benefit of U.S. Provisional Application Ser. Nos. 60/793,665, filed Apr. 19, 2006, entitled "A Hybrid Nanotube/CMOS Dynamically Reconfigurable Architecture;" and 60/919,225, filed Mar. 21, 2007, entitled "NanoMap: An Integrated Design Optimization Flow for a Hybrid Nanotube/CMOS Dynamically Reconfigurable Architecture." Each of the above-identified related applications are incorporated herein by this reference.

GOVERNMENT RIGHTS

This invention was made with government support under Grant #CCF-0429745 awarded by the National Science Foundation. The Government has certain rights in the invention.

FIELD OF THE INVENTION

This invention relates generally to reconfigurable computer architectures, and particularly to CMOS compatible field-programmable gate arrays (FPGAs) having non-volatile universal memories supporting fine-grain reconfiguration to enable temporal logic folding, along with an RTL/gate-level automatic design optimization method and system.

BACKGROUND OF THE INVENTION

After consistently providing large improvements in productivity and performance for more than two decades, CMOS is expected to approach its physical limits in the coming decade. To enable future technology scaling, intensive research is being directed towards the development of nanoscale molecular devices, such as carbon nanotube and nanowire. Such nanodevices demonstrate superior characteristics over MOSFET in terms of integration density, performance, power consumption, etc. However, lack of a mature fabrication process is a roadblock in implementing chips using these nanodevices. If photo-lithography could be used to implement structures made from these nanodevices, then such structures could be combined with CMOS logic to create hybrid CMOS/nanochips, which could leverage the beneficial aspects of both technologies.

Motivated by the impressive potential of nanotechnologies, researchers are investigating nanoelectronic circuits and architectures. If such circuits/architectures are implemented using bottom-up chemical self-assembly techniques, then the chip defect levels are expected to be high (between 1% and 10%). To be able to deal with such high defect levels, regular architectures are favored. Reconfigurable architectures, in addition to being regular, allow reconfiguration around fabrication defects as well as run-time faults. Thus, both regular and reconfigurable architectures have found popularity.

SUMMARY OF THE INVENTION

The present invention provides a hybrid CMOS/non-volatile universal memory reconfigurable architecture, referred to as NATURE. In one embodiment, the present invention is based on CMOS logic and high-density high-speed non-volatile nanotube random-access memory. In one instance, NRAM® of Nantero, Inc., identifies a source of nanotube random-access memory chips. Nanotube random-access memory chips can be fabricated using CMOS-compatible manufacturing processes. Thus, architectures of the present invention can also be fabricated with currently-available processes.

The present invention exploits the excellent properties of non-volatile universal memories, including NRAM® chips, and distributes them in a reconfigurable fabric to act as on-chip storage for multi-context reconfiguration bits. Non-volatile memories include the emerging technologies of carbon nanotube RAMs, phase change RAMs, magnetoresistive RAMs, and ferroelectric RAMs (FRAMs). Although certain illustrated embodiments of the present invention describe implementation using NRAM® chips, the present invention is not limited to such use. All alternative emerging non-volatile technologies could be implemented and are contemplated in the present invention.

The logic implemented in the logic elements of the reconfigurable architecture of the present invention can be changed every few cycles, making both coarse-grain and fine-grain dynamic reconfiguration possible. The present invention thereby addresses two primary challenges in existing CMOS-based FPGAs: logic density and efficiency of run-time reconfiguration. Traditional reconfigurable architectures only allow partial dynamic reconfiguration, (i.e., only a part of the architecture can be reconfigured at run-time) due to the area overhead associated with SRAMs that store the reconfiguration bits and the long latency of reconfiguration due to the accessing of off-chip storage. Since the access latency of on-chip storage is small, on-chip storage provides an opportunity to store multiple logic designs in the on-chip storage, and to invoke different designs through fine-grain dynamic reconfiguration.

Moreover, the ability to reconfigure the architecture of the present invention every few cycles provides for temporal logic folding, (i.e., the possibility of folding the logic circuit in time and mapping each fold to the same logic elements in the architecture). This provides significant gains (an order of magnitude or more for larger circuits) in the area-time product (where time refers to circuit delay, or latency) compared to traditional reconfigurable architectures, while allowing the flexibility of trading area for performance. For instance, a large logic circuit can be partitioned into a sequence of logic stages and stored in the on-chip configuration memory. At run-time, stage-by-stage, the logic circuit can be configured into the same hardware and executed in different clock cycles. Logic folding increases logic elements utilization, providing high logic density and a capability of using cheaper chips, having smaller capacities, to execute similar applications, hence, making them attractive for use in cost-conscious embedded systems.

In one exemplary realization, the architecture of NATURE includes island-style logic blocks, connected by a hierarchical reconfigurable interconnect fabric, where each logic block contains a super-macroblock (SMB) and a local switch matrix. The SMB includes a two-level logic cluster. The first level consists of a set of macroblocks (MBs). Each MB is composed of a set of logic elements (LEs). Low-latency reconfigurable crossbars are used to form local inter-MB and inter-LE connections. In NATURE, LE is the atomic functional element, and includes look-up tables (LUTs) and flip-flops. Each m-input LUT can realize any m-variable Boolean functions. Flip-flops are used to hold computation results which are used by subsequent cycles.

In this exemplary realization, support for reconfiguration is provided by using nanotube random-access memories as on-chip configuration storage, distributed within each level of logic and interconnect hierarchy. Each individual logic or interconnect element is associated with, or physically adjacent and connected to, a k-set nanotube random-access memory storage. Therefore, k different logic functions can be realized within the same hardware resource without accessing off-chip storage, thereby providing significant improvement in logic density with only moderate area cost and delay overhead. Also, since logic folding results in most communication being local, the need for global interconnect is greatly reduced.

Temporal logic folding enables a realization of different Boolean functions within the same LE in different clock cycles. For instance, traditionally a logic circuit consisting of n serially-connected LUTs requires n LUTs. With the temporal logic folding support of the present invention, all n LUTs can be potentially mapped to a single LE, via n configuration sets stored in a respective nanotube random-access memory. The subject logic circuit can then be executed cycle-by-cycle through run-time on-chip reconfiguration.

Different folding levels result in different circuit performance and area efficiency. Given a logic circuit, increasing the folding level leads to a higher clock period, but smaller cycle count, since a larger number of logic operations need to be performed within a single clock cycle. Since a constant latency is associated with each run-time reconfiguration, the overall circuit latency decreases as the folding level increases. On the other hand, increasing the folding level can result in much higher LE resource requirements. Accordingly, design flexibility is provided, and balancing performance capabilities with area efficiencies is always a consideration.

The present invention also provides an integrated design optimization platform for NATURE, referred to as NanoMap. NanoMap conducts design optimization from the RTL down to the physical level. Given an input design specified in RTL and/or gate-level VHDL, NanoMap optimizes and implements the design on NATURE through logic mapping, temporal clustering, placement, and routing. The design optimization techniques of the present invention exploit the design flexibilities enabled by fine-grain temporal logic folding. Given user-specified area and performance constraints, the mapping method and system of NanoMap can automatically explore and identify the best logic folding configuration, and make appropriate tradeoffs between performance and area efficiency. The present invention uses a force-directed scheduling (FDS) technique to balance resource use across different logic folding cycles. Combining NanoMap with existing commercial architectural synthesis tools provides a complete design automation flow for NATURE.

Accordingly, aspects of the present invention will be seen variously to:

provide a high-performance non-volatile memory-based reconfigurable architecture enabling run-time coarse-grain to fine-grain (i.e., cycle-by-cycle) reconfiguration and temporal logic folding;

be reliably fabricated using CMOS-compatible manufacturing processes;

provide flexibility in achieving different optimization objectives based upon user specified constraints;

provide flexibility in selecting best temporal folding levels and to perform area-delay trade-offs;

be capable of reaching LE utilization of nearly 100%;

reduce by 50% or more a need for deep interconnect hierarchy when using level-1 folding;

provide an order of magnitude increase in logic density relative to current technologies; and significantly improve area/execution time features of FPGAs.

In one aspect of the invention, a reconfigurable computer architecture, or field-programmable gate array, is provided that includes a plurality of programmable elements and at least one, separate random access memory associated with, or physically adjacent and connected to, each programmable element. The reconfigurable architecture could equally include a separate random access memory associated with each of a plurality of logic elements, or reconfigurable blocks. The random access memory is a non-volatile memory such as a carbon nanotube RAM, phase change RAM, magnetoresistive RAM, or ferroelectric RAM (FRAM). The random access memory can store run-time reconfiguration bits of the respective programmable element/logic element/reconfigurable block, or could store data on-chip, or could store both run-time reconfiguration bits and data on-chip. Further, data storage could be distributed across the respective RAM chip.

In a further aspect, n-programmable elements and n-random access memories comprise a macro-block (MB), m-macro-blocks and m-random access memories comprise a super macro-block (SMB), and one SMB and one local switch matrix comprise a logic block (LB). A plurality of LBs could be included in the architecture. In one embodiment of the invention, the value of m and n is four (4).

In another instance, the reconfigurable architecture could include a plurality of logic elements; and an equal number of random access memories, where one random access memory is physically adjacent and connected to each logic element. The random access memory stores run-time reconfiguration bits of the respective logic element. The logic element further includes two flip-flops, where different computation values are stored in each of the two flip-flops at any point in time. In an alternative embodiment, switch blocks replace the logic elements.

The present invention also provides a method of run-time reconfiguration, where reconfiguration bits are written into a first random access memory at a time of initial configuration from off-chip storage, and reconfiguration bits are placed into a second random access memory during run-time reconfiguration to configure one or more logic elements or switches to implement different logic functionality or interconnections. In one instance, reconfiguration commences at one edge of clock signal, followed by computation at another edge of the clock signal. The method could provide that the first random access memory is nanotube random access memory, and the second random access memory is a static random access memory.

In another method of run-time reconfiguration, a series of n-serially connected look-up tables (LUT1, LUT2, . . . , LUTn) are mapped to a logic element (LE), and the LE is configured to implement LUT1 in a first cycle, to implement LUT2 in a second cycle, and continuing until configuring the LE to implement LUTn in nth cycle, wherein n cycles are needed for execution. Moreover, the LE could be configured to implement LUT1 in a first cycle, wherein LUT1 is then executed in the first cycle, the LE is then configured to implement LUT2 in a second cycle, wherein the LUT2 is then executed in the second cycle, with the method continuing until the LE is configured to implement LUTn in nth cycle, and LUTn is executed in the nth cycle. In certain embodiments, all communications between the LUTs could be local. As a variation to the method, a second LE could execute a LUT in the first cycle using output from the execution of the first LUT by the LE in the first cycle.

An alternative method maps one or more of a series of look-up tables (LUTs) to one or more logic elements (LEs), each LE is configured to implement a LUT in a first cycle, and after implementation of two sequential LUT computations, each LE is reconfigured to implement a LUT in a second cycle.

In a method for determining a logic folding configuration, and for balancing resource use across the logic folding configuration, an input circuit design specified in register-transfer level or gate-level VHDL is provided, and a folding level us determined by: 1) identifying each plane of the input circuit design; 2) obtaining circuit parameters within each plane; and 3) and by obtaining a user optimization objective. The register-transfer level or gate-level VHDL module is then partitioned into LUTs and LUT clusters, which are then assigned to a folding stage. The LUTs and LUT clusters are then mapped to a super-macroblock (SMB), and are then placed to specific macroblocks (MB) and logic elements (LE). Intra-SMB and inter-SMB routing is determined, then a layout generated for each folding stage and a configuration bitmap for each folding cycle of the reconfigurable architecture.

BRIEF DESCRIPTION OF THE DRAWINGS

For the purpose of illustrating the invention, there is shown in the drawing(s) a form that is presently preferred; it being understood, however, that this invention is not limited to the precise arrangements and instrumentalities shown.

FIG. 8 illustrates experimental circuit mapping results of one instance of a reconfigurable architecture of the present invention;

FIG. 18a illustrates an example Register Transfer Level (RTL) circuit, FIG. 18b a module partition, and FIG. 18c a mapping result thereof, to demonstrate a design optimization method and system of the present invention;

FIG. 22a illustrates a storage lifetime for the ASAP schedule of FIG. 21a, FIG. 22b illustrates a storage lifetime for the ALAP schedule of FIG. 21b, and FIG. 22c illustrates a maximum storage lifetime for source distribution computations during Distribution Graph (DG) creation;

FIG. 25 illustrates experimental circuit mapping results of instances of the design optimization method and system of the present invention.

DETAILED DESCRIPTION OF ILLUSTRATIVE EMBODIMENTS

Figure 1:
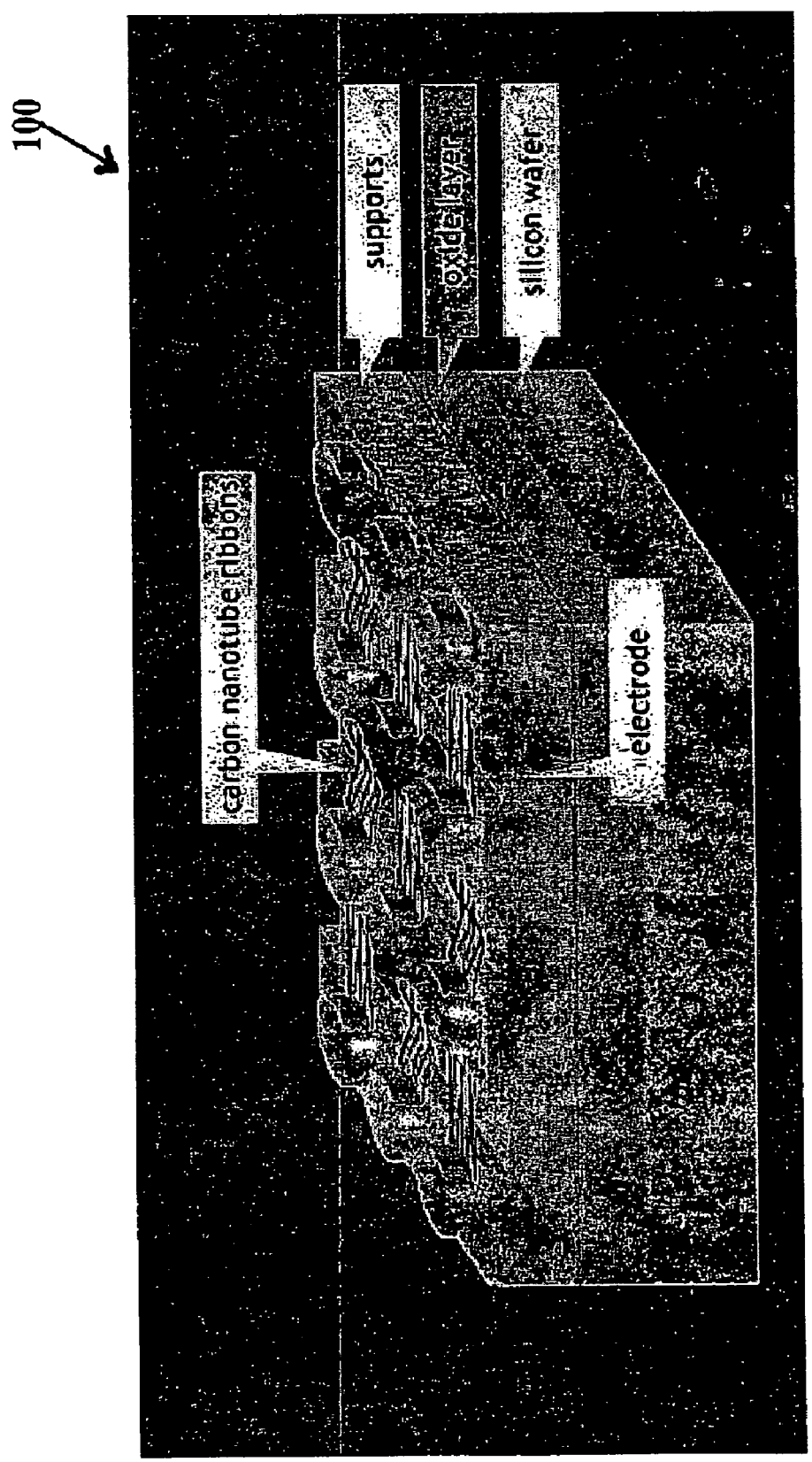
FIG. 1 illustrates structure of a nanotube random access memory.

A high-performance run-time reconfigurable architecture is provided, along with a design optimization method and system to efficiency balance performance and area considerations of the architecture. A high-density, high-speed non-volatile memory is implemented in the architecture to enable cycle-by-cycle reconfiguration and logic folding. Choice of different folding levels allows the designer flexibility in performing area-performance trade-offs. The significant increase in relative logic density (more than an order of magnitude for larger circuits) made possible by the present invention can allow the use of cheaper reconfigurable architectures with smaller logic capacities to implement the same functionality, thus giving a boost to such use in cost-conscious embedded systems.

One embodiment of the invention implements a non-volatile nanotube random-access memory, that is considerably faster and denser than DRAM, has much lower power consumption than DRAM or flash, has similar speed to SRAM and is highly resistant to environmental forces (temperature, magnetism). Use of highly-dense nanotube random-access memories, such as a NRAM® chip, or of other emerging non-volatile memory technologies, including Phase Change RAMs, Magnetoresistive RAMs, and Ferroelectric RAMs (FRAMs), allows on-chip multi-context configuration storage, thereby enabling fine-grain temporal logic folding of a circuit before mapping to the architecture.

Reconfigurable architectures do exist in the art. However, their teachings are limited to allowing later stages of a pipeline to be executed in a same set of logic blocks that executed an earlier stage of the pipeline. This can be regarded as coarse-grain temporal folding. However, such architectures are largely limited to stream media or DSP applications. The present invention, on the other hand, supports fine-grain temporal folding, and is without the application limitations present in current reconfigurable architectures. Current reconfigurable architectures are described in the following, which is incorporated herein by reference for its useful background information:

S. C. Goldstein, H. Schmidt, M. Budiu, S. Cadambi, M. Moe, and R. R. Taylor, "PipeRench: A Reconfigurable Architecture and Compiler," Computer, vol. 33, pp 70-77, April 2000.

Carbon Nanotube & NRAM® Chips

Carbon nanotubes are hollow cylinders composed of one or more concentric layers of carbon atoms in a honeycomb lattice arrangement. The diameter of a nanotube is usually a few nanometers and length up to millimeters. Nanotubes exhibit unique electronic, mechanical and chemical properties. For example, carrier transport in nanotube is ballistic in the micrometer range and allows current densities as high as $10^9$ A/cm$^2$. These properties of nanotubes make them very attractive building blocks for molecular electronics.

Carbon nanotube random-access memories are described in the following, which is incorporated herein by reference for its useful background information:

J. W. Ward, M. Meinhold, B. M. Segal, J. Berg, R. Sen, R. Sivarajan, D. K. Brock, and T. Rueckes, "A Non-Volatile Nanoelectromechanical Memory Element Utilizing a Fabric of Carbon Nanotubes," in Proc. Non-Volatile Memory Technology Symp., pp 15-17, November 2004.

FIG. 1 shows a basic structure of a carbon nanotube random-access memory 100, such as a NRAM® chip. Memory cells are fabricated in a two-dimensional array using photolithography. Each memory cell comprises multiple suspended nanotubes, support and electrode. The memory state is determined by the state of the suspended nanotubes—whether they are bent or not leads to well-defined electrostatically switchable ON/OFF states. When opposite voltages are applied to the support and electrode of a memory cell, the suspended nanotubes are bent due to VanderWals forces, reducing the resistance between the nanotubes and electrode to as low as several hundred ohms, corresponding to the "1" state. On the other hand, when the same high voltage is applied to the support and electrode, the nanotube remains straight or returns from the "1" state, resulting in a resistance of several Gigaohms, which is defined as the "0" state. Such ON/OFF states have been shown to be both electrically and mechanically very stable.

Phase Change RAMs, Magnetoresistive RAMs, and Ferroelectric RAMs (FRAMs)

Phase Change RAMs, Magnetoresistive RAMs, and Ferroelectric RAMs (FRAMs) are each respectively detailed in the following, each of which are incorporated herein by reference for their useful background information:

S. Lai, "Current status of the phase change memory and its future," in Proc. Int. Electron Devices Meeting, December 2003, pp. 10.1.1-10.1.4.;

S. Tehrani, J. M. Slaughter, M. Deherrera, B. N. Engel, and N. D. Rizzo, "Magnetoresistive random access memory using magnetic tunnel junctions," Proc. IEEE, vol. 91, pp. 703-714, 2003;

G. R. Fox, F. Chu, and T. Davenport, "Current and future ferroelectric non-volatile memory technology," J. Vacuum Science Technology B., vol. 19, pp. 1967-1971, 2001.

NATURE Architecture

Figure 2:
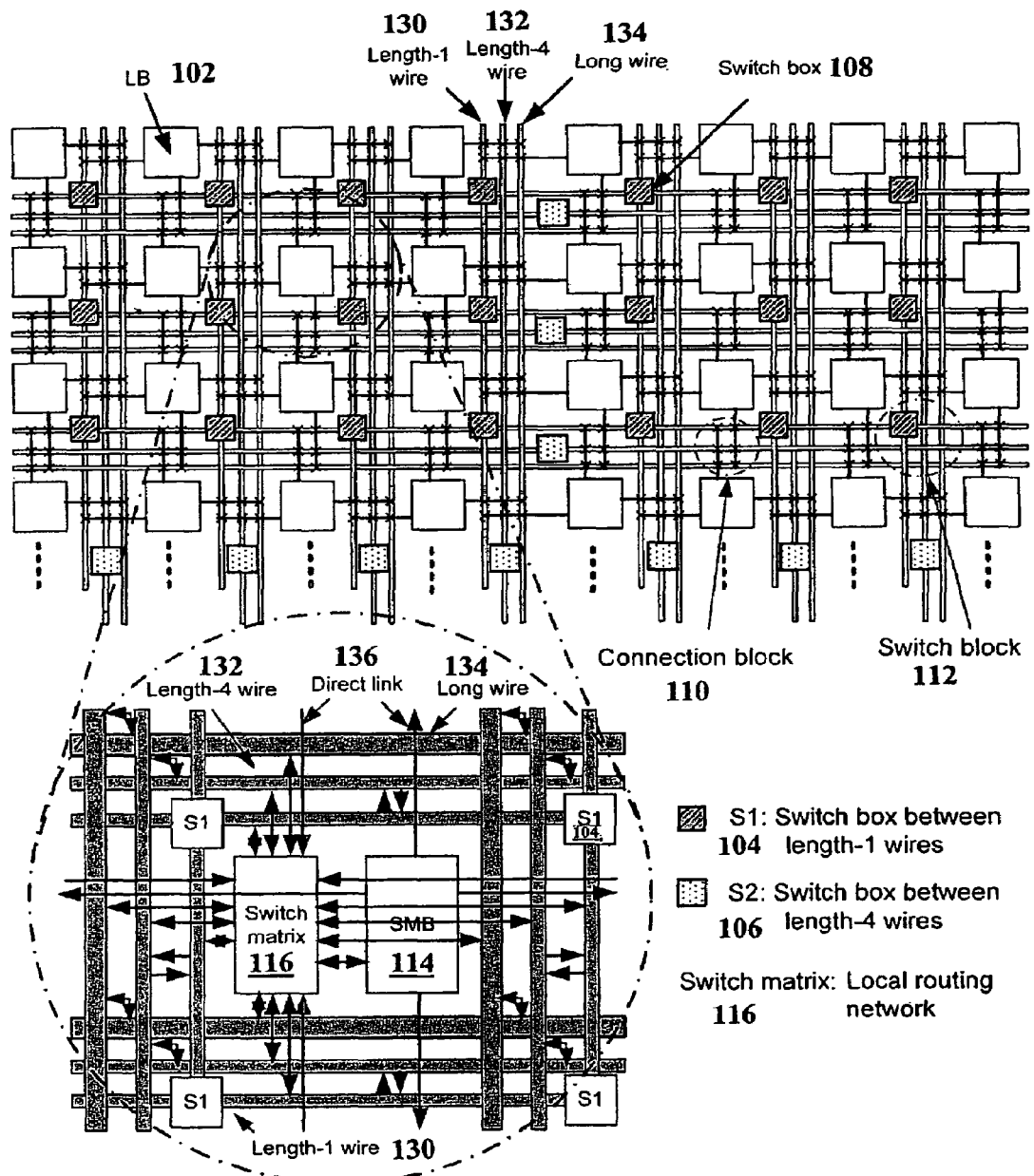
FIG. 2 illustrates a high level view of the architecture of the present invention.

A high-level view of the architecture of the present invention is shown in FIG. 2. In this embodiment, island-style logic blocks 102 (LBs) are illustrated and are connected by various levels of interconnect. Several types of wire segments are used to support local and global communications among LBs-102. S1 104 and S2 106 refer to switch boxes 108 that connect wire segments. Connection blocks 110 and switch blocks 112 are as indicated in FIG. 2. An LB 102 contains a super-macroblock (SMB) 114 and a local switch matrix 116. The inputs/outputs of an SMB 114 are connected to the interconnection network through a switch matrix 116 and neighboring SMBs 114 are also connected through direct links.

Super-Macroblock (SMB) Architecture

Figure 3:
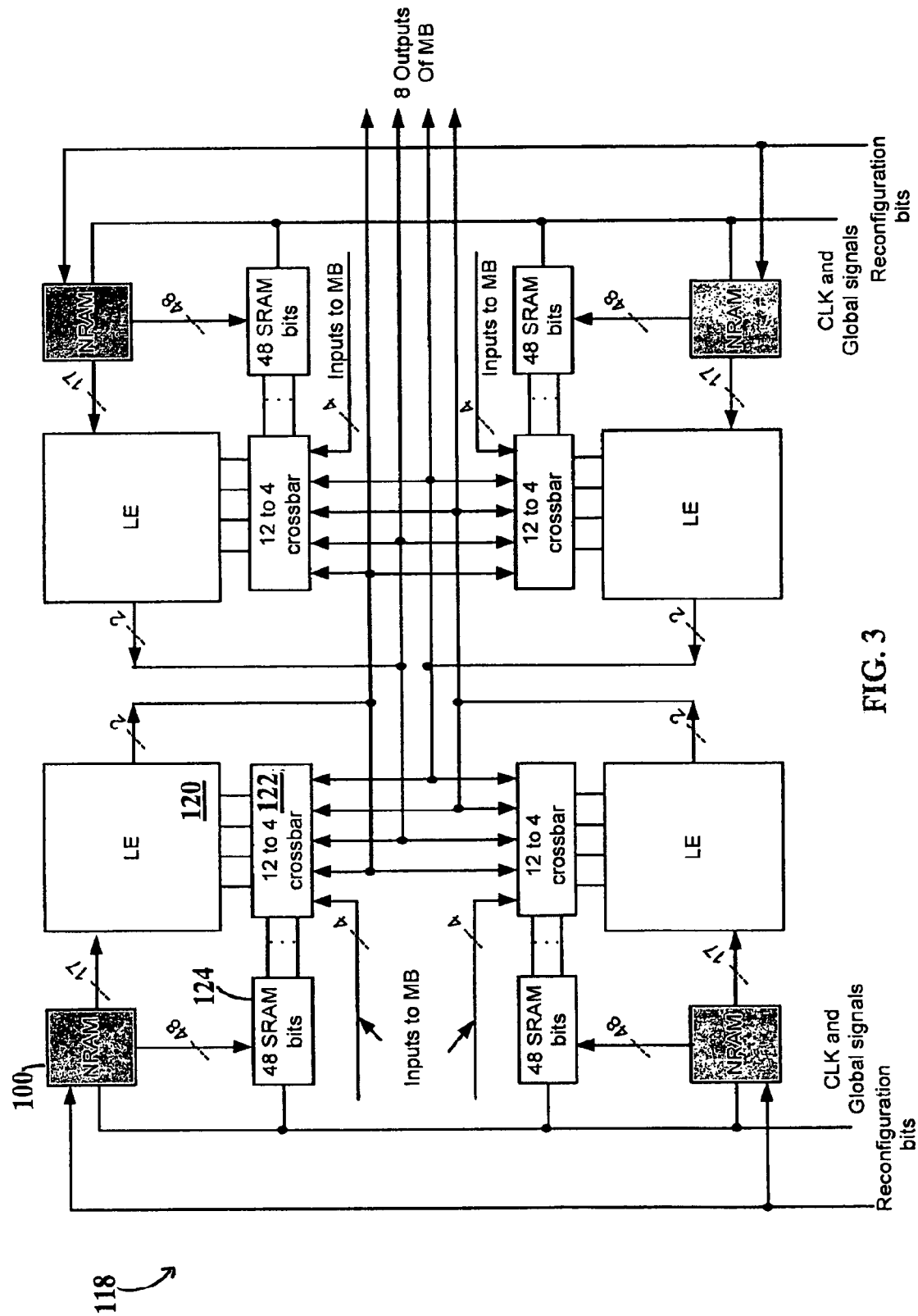
FIG. 3 illustrates an architecture of a lower level macroblock (MB), in accordance with the present invention.
Figure 4:
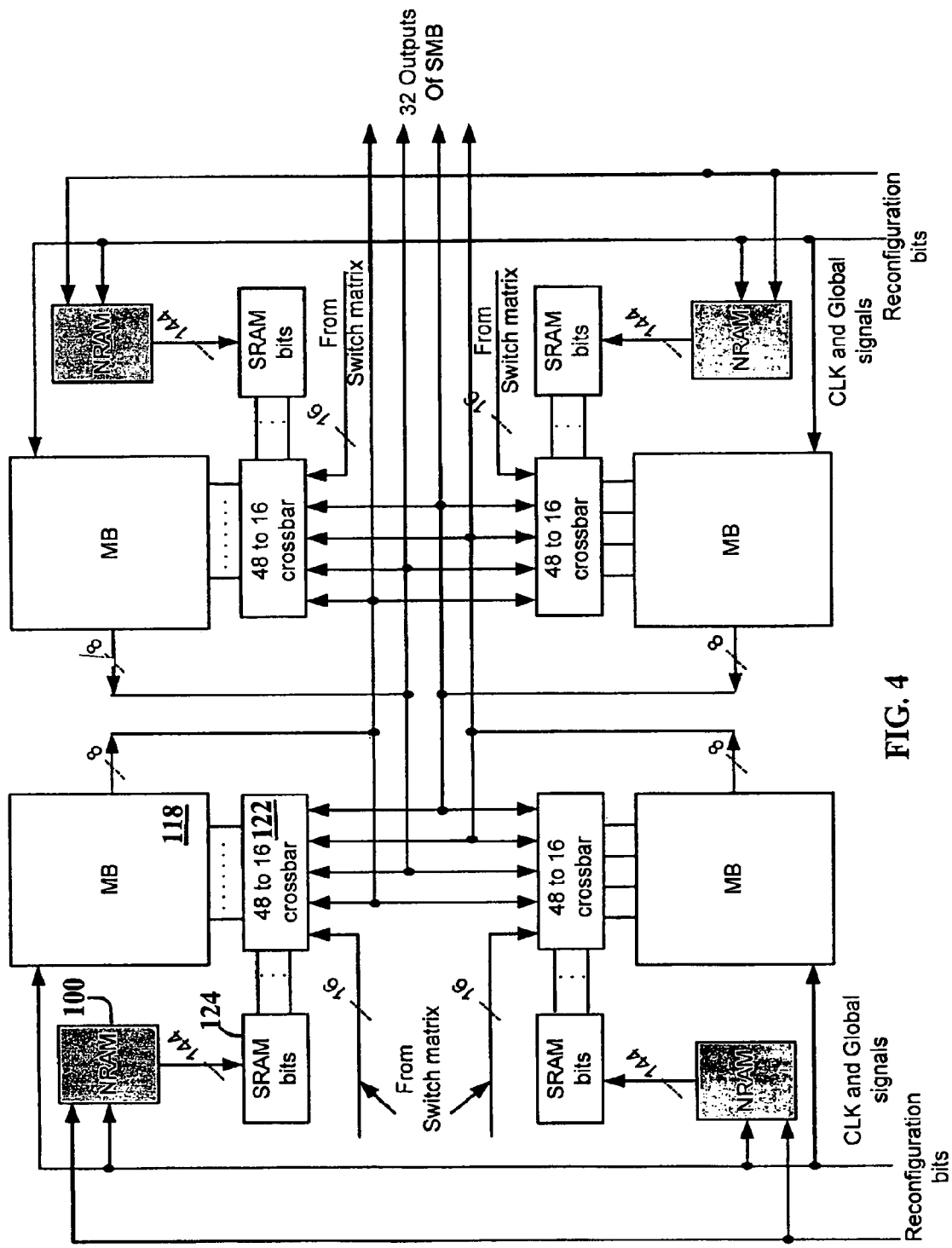
FIG. 4 illustrates an architecture of a higher level super macro-block (SMB), in accordance with the present invention.

The embodiment of the invention illustrated in FIGS. 2-4 present two levels of logic clusters in an LB 102 to facilitate temporal logic folding of circuits, and enable most inter-block communications to be local. The first (i.e., lower) level, called the macroblock (MB) 118 level, is shown in FIG. 3.

An MB 118 contains $n_1$ m-input reconfigurable logic elements (LEs) 120 (in this figure, $n_1$=4). In the second level, $n_2$ MBs 118 comprise an SMB 114, as shown in FIG. 4 (in this figure, $n_2$=4). In the embodiments illustrated in FIGS. 3 and 4, each LE 120 and MB 118 is associated with (physically adjacent and connected to) a nanotube RAM 100, perhaps a NRAM® chip. Alternative embodiments of the invention include other emerging non-volatile universal memories, such as phase change RAMs, magnetoresistive RAMs, and/or ferroelectric RAMs. Any could be implemented instead of an NRAM® chip.

Within an MB 118 or SMB 114, communications among various components can take place through a local crossbar 122. In this embodiment, a crossbar 122 is selected instead of a multiplexer at this level to speed up local communications. Since a crossbar 122 requires more SRAM 124 control bits, a slight price in area is exchanged for faster speed. However, since logic folding enables significant area savings, this area penalty is negligible. As shown in FIG. 3, the m inputs of a LE 120 can arrive from the outputs of other LEs 120 in the MB 118 or from the inputs to the MB 118. Similarly, the inputs of an MB 118 can arrive from the outputs of other MBs 118 or from the inputs to the SMB 114 through the switch matrix 116. The outputs (two in this embodiment) from an LE 120 can be used within the MB 118 or can go to the upper level SMB 114 or go to other SMBs 114 through the routing network. This logic/interconnect hierarchy maximizes local communications and provides a high level of design flexibility for mapping circuits to the architecture.

An LE 120 implements a basic computation. The LE 120 can include an m-input look up table (LUT) 126 and a flip-flop 128 (see FIG. 11(a), detailed below). The m-input LUT 126 can implement any m-variable boolean function. The flip-flop 128 stores the internal results for future use (when a circuit is temporally folded, the result of a previous stage is often needed by a subsequent stage). A pass transistor can be used to decide if the internal result will be stored or not.

Run-time Reconfiguration

Run-time reconfiguration is mainly enabled by the carbon nanotube RAM 100 (or phase change RAMs, magnetoresistive RAMs, or ferroelectric RAMs) distributed throughout the architecture. The structure and operation of a carbon nanotube RAM are similar to those of a traditional memory. One minor difference is that in a carbon nanotube RAM, counters can be used instead of decoders as periphery circuits since reconfiguration bits for different logic contexts are read out in order.

A carbon nanotube RAM 100 is associated with each reconfigurable block (e.g., LE 120 or switch block 112, etc.,) to store its run-time reconfiguration bits. Reconfiguration commences at one edge of the clock signal CLK, followed by computation at another edge of CLK. Reconfiguration bits are written into the carbon nanotube RAMs 100 at the time of initial configuration from off-chip storage. During run-time reconfiguration, reconfiguration bits are placed into SRAM 124 cells to configure the LE 120 or switch block 112 to implement different logic functionality or interconnections. For example, if k configuration sets are stored in a carbon nanotube RAM 100, then the associated components can be reconfigured k times during execution. As an example, for the MB 118 architecture embodiment shown in FIG. 3, 65 reconfiguration bits are required for a complete configuration set (when m=4). In this set, 16 bits are required for each 4-input LUT, and one bit for determining whether to store the internal result or not. Hence, when $n_1=4$, m=4, and k configuration sets are used, the total number of carbon nanotube RAM bits required for one MB is $65kn_1$.

Inclusion of carbon nanotube RAMs 100 (or phase change RAMs, magnetoresistive RAMs, or ferroelectric RAMs) in the LB 102 incurs area overhead. Assuming a 100 nm technology for implementing CMOS logic, 100 nm nanotube length, and k=16, the carbon nanotube RAMs 100 occupy roughly 10.6% of the LB 102 area. However, through carbon nanotube RAM-enabled logic folding, the number of LBs 102 required to implement a circuit is reduced nearly k-fold. To account for these facts, the concept of relative logic density is introduced, and is defined as the ratio of the amount of logic that architectures of the present invention can implement in a given amount of area compared to the amount of logic a traditional reconfigurable architecture can implement in the same amount of area. When k=16 and assuming the circuit being implemented can use 16 configurations (as most large circuits would), the relative logic density can be calculated as 16(1−0.106)=14.3. This means that in the same area, architectures of the present invention can implement roughly 14 times more logic than a traditional architecture, or equivalently needs 14 times less area to implement the same functionality.

It can be seen that both the carbon nanotube RAM size and relative logic density vary with the value of k. If k is too small, more global communication may be needed. If k is too large, it may not be possible to make use of the extra configurations, thus leading to wasted carbon nanotube RAM area that could have been put to other use. Since the best k value varies with the specific design, the value of k can be obtained through a design optimization technique, NanoMap, introduced below, or through design space exploration of the architecture with various values of k and mapping a large number of circuits to that instance of the architecture. In many instances, k=16 is a preferred value.

To further improve the performance of the architecture at the expense of increased area, one can use a shadow reconfiguration SRAM to hide the reconfiguration latency for transferring bits from the carbon nanotube RAMs to the SRAMs. This allows one group of SRAM bits to load reconfiguration bits from nanotube NRAMs, while another SRAM group supports the current computation. The performance improvement due to this feature will depend on the level of logic folding.

Interconnect Design

Reconfigurable interconnect resources are provided in reconfigurable architectures to enable communication between programmable LBs 102. Interconnect design is very important for reconfigurable architectures because routing delays can be quite large, and most of the chip area is devoted to programmable routing. Consequently, the routing architecture must be designed to be both fast and area-efficient, and to aid logic folding and local communication.

There are primarily two methods for providing both local and global routing resources: segmented routing and hierarchical routing. One embodiment of the present invention uses a hybrid of segmented and hierarchical routing. In this embodiment, within the SMB 114, the interconnect is hierarchical to aid the logic clusters and local communication. To connect SMBs 114, wire segments of various lengths are used. In segmented routing, short wires accommodate local traffic. Such wires are connected together using switch boxes to emulate long wires.

The following routing architecture features address an interconnect structure of the present invention:
- The length of each routing wire segment (i.e., how many LBs a routing wire spans before terminating);
- The number of wires (tracks) in each routing channel;
- The type of each routing switch: pass transistor, tri-state buffer or multiplexer (MUX);
- Location of routing switches and which routing wires they connect; and
- Size of transistors in the switches and the metal width and spacing of the routing wires.

For the length of each routing wire segment, since too many short wires decrease circuit performance, and too many long wires provide little routing flexibility and may waste area, one embodiment of the present invention implements a mixed wire segment scheme including length-1 130, length-4 132, and long wires 134. Length-1 130 (length-4 132) wire segments span one (four) LB(s) 102 before connecting to a switch block 112, while long wires 134 traverse the chip horizontally and vertically, connecting to each LB 102 along the way. Besides these wire segments, there are also direct links 136 from the outputs of one LB to its four neighboring LBs, further facilitating local communications.

Figure 5A:
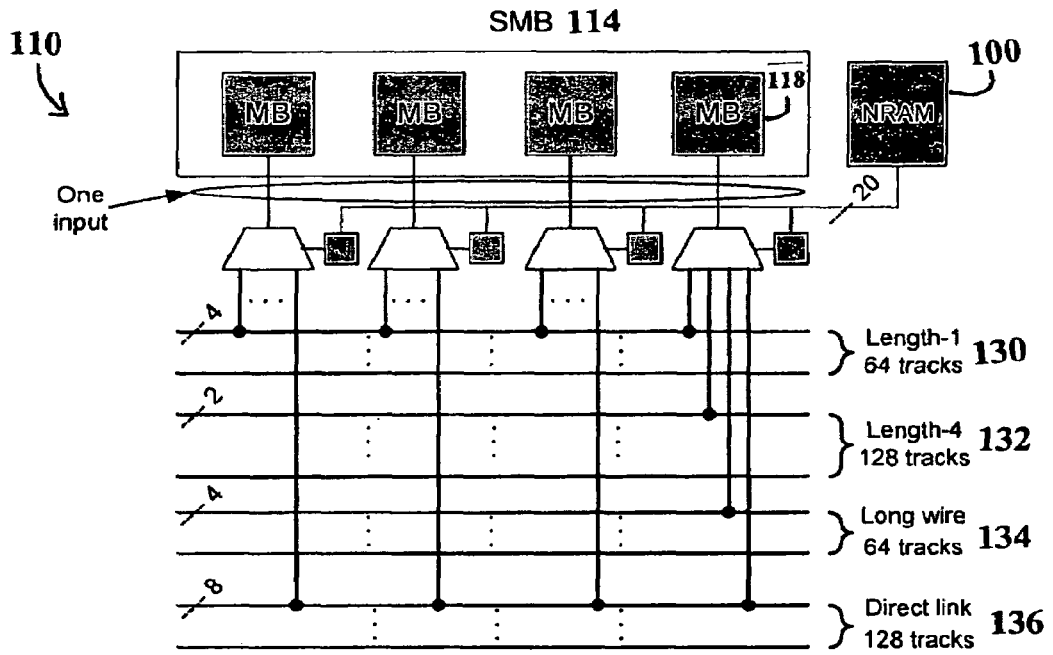
FIG. 5a illustrates a connection block for one input of a MB, and FIG. 5b a connection block for one output from a MB, in accordance with aspects of the present invention.
Figure 5B:
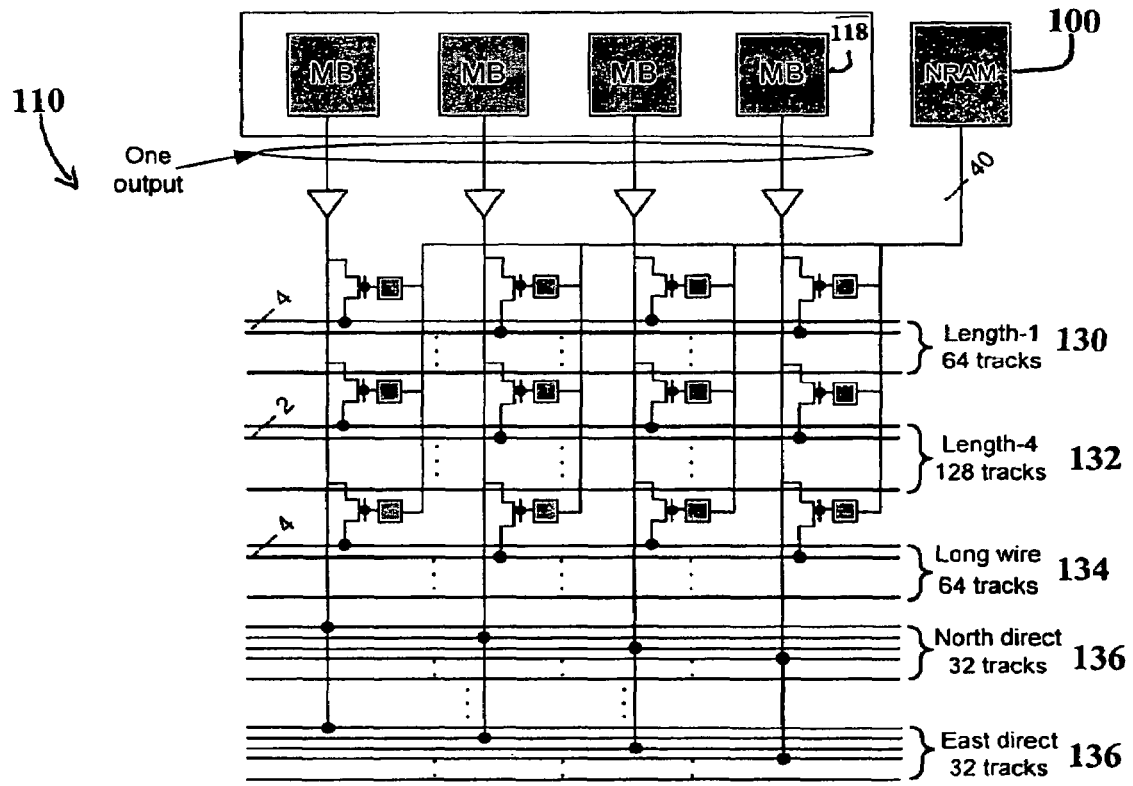

To address the number of wires (tracks) in each routing channel, for the architecture instance in which $m=n_1=n_2=4$, I=64, and O=32 (where I/O refers to the number of inputs/outputs of an SMB), one embodiment of the invention implements 128 horizontal and vertical tracks and assume a 25%, 50%, and 25% distribution for length-1 130, length-4 132, and long wires 134, respectively, among the 128 tracks in each direction. In addition, 32 tracks are used for direct links 136 between adjacent SMBs (since O=32). FIG. 5 illustrates one embodiment of how the inputs/outputs of an SMB 114 are connected to the routing network.

Figure 6:
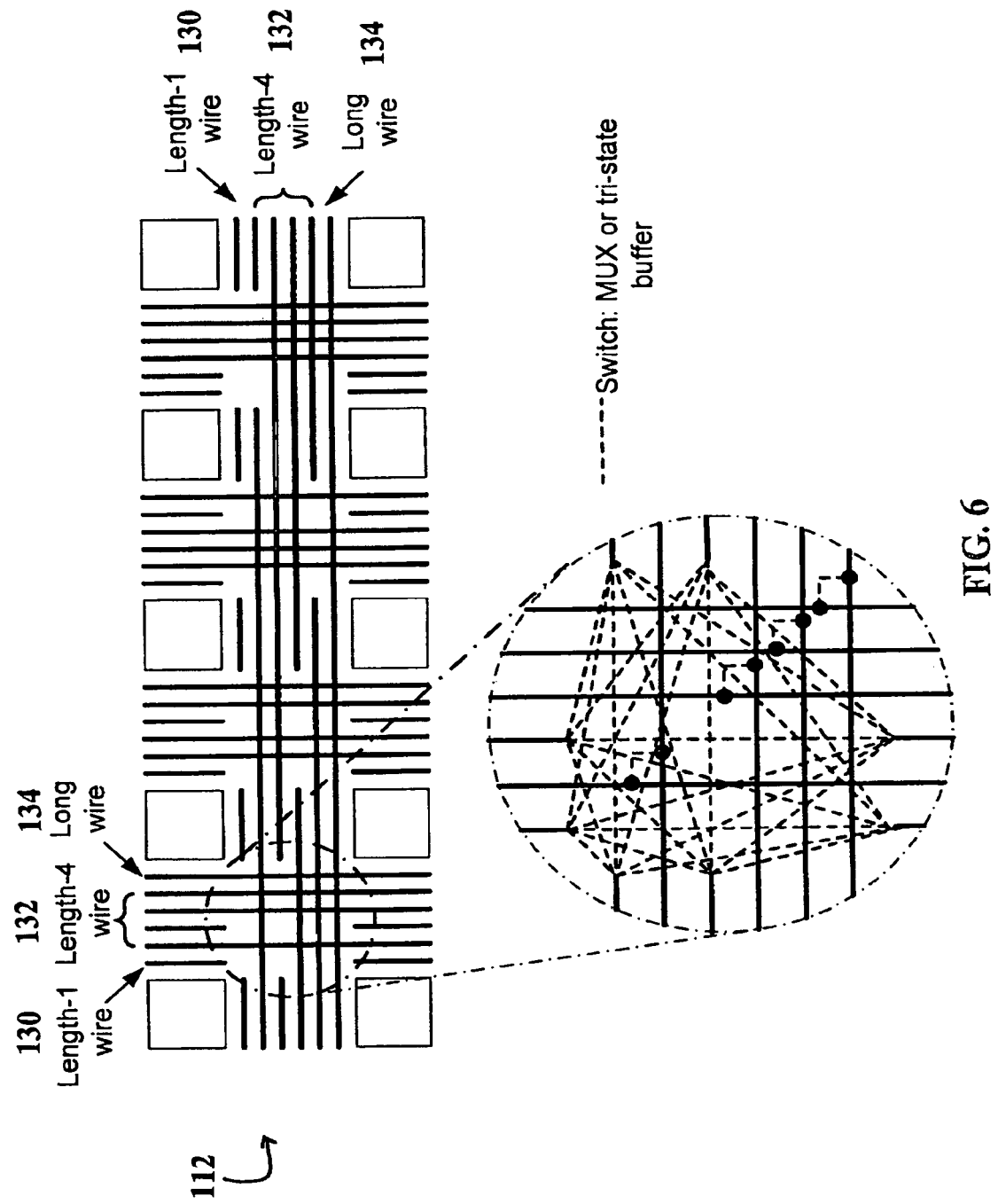
FIG. 6 illustrates a switch block in accordance with the present invention.

Next is a consideration of the design of the connection block 110, characterized by $F_c$, and switch block 112, characterized by $F_s$ ($F_c$ refers to the number of adjacent tracks a pin of an LB can connect to and $F_s$ the number of tracks to which each track entering the switch block can connect). Higher values of $F_c$ and $F_s$ result in higher routing flexibility, however, at the expense of a higher number of switches and hence more routing area. For a cluster of N LUTs, $F_c$ can be chosen as 1/N of the total number of tracks and $F_s$ should be greater than three in order to achieve routing completion while maintaining area efficiency. In one embodiment of the invention, $F_c=1/N$ and $F_s=6$ is used. Another related and important issue is whether or not the internal connection blocks or switch blocks should be populated (such a block is said to be populated if it is possible to make connections from the middle of the block to LBs or to other blocks). When both are fully populated, the number of routing tracks required to achieve routing completion can be reduced, at the expense of a larger number of switches attached to a wire (resulting in more capacitance and, hence, decrease in speed). In one embodiment of the invention, the connection blocks are depopulated and the switch blocks are populated to provide the best performance-area advantage. FIG. 6 shows an example connection of disjoint switch blocks 112.

The third feature considers the type of switch. There are typically three types of switches: pass transistor, multiplexer and tri-state buffer. Since a pass transistor has the shortest switching time, pass transistors are implemented in one embodiment of the invention for the local crossbars within the MB and SMB. A multiplexer has longer delay, but needs fewer reconfiguration bits. Therefore, a multiplexer 138 is implemented in one embodiment of the invention to connect to the inputs of a SMB 114 (e.g., see FIG. 10, detailed below). The outputs of an SMB can be connected to long interconnects through tri-state buffers in the switch matrix.

For the last feature, one embodiment of the invention uses pass transistors that are 10 times the size of a minimum-sized transistor and five times the size of a minimum-sized transistor for tri-state buffers and multiplexers. Minimum width and spacing are used for the metal wires.

Temporal Logic Folding

Temporal logic folding provides design flexibility and benefits in the present invention. The basic idea behind logic folding is that one can use run-time reconfiguration, and in one embodiment of the invention nanotube RAM-enabled run-time reconfiguration, to realize different Boolean functions in the same LE every few cycles. For example, suppose a subcircuit can be realized as a series of n serially connected LUTs. Traditional reconfigurable architectures will need n LUTs to implement the subcircuit. However, using run-time reconfiguration, at one extreme all these LUTs can be mapped to a single LE, which is configured to implement LUT1 in the first cycle, LUT2 in the second cycle, and so on, requiring n cycles for execution. Traditional reconfigurable architectures only support partial dynamic reconfiguration and do not allow such fine-grain temporal logic folding. Moreover, all communications between the LUTs mapped to the same LE are local. Hence, global communication is reduced, and routing delay is significantly reduced as well.

Logic folding occurs at the expense of reconfiguration time. However, results reveal that the time required to output the reconfiguration bits from an carbon nanotube RAM to the SRAM (i.e., the reconfiguration time to switch from one LUT to another), is only around 160 ps. This is small compared to routing delay saved. Also, by allowing use of shadow SRAM, the reconfiguration time can be hidden by overlapping computation.

Figure 7A:
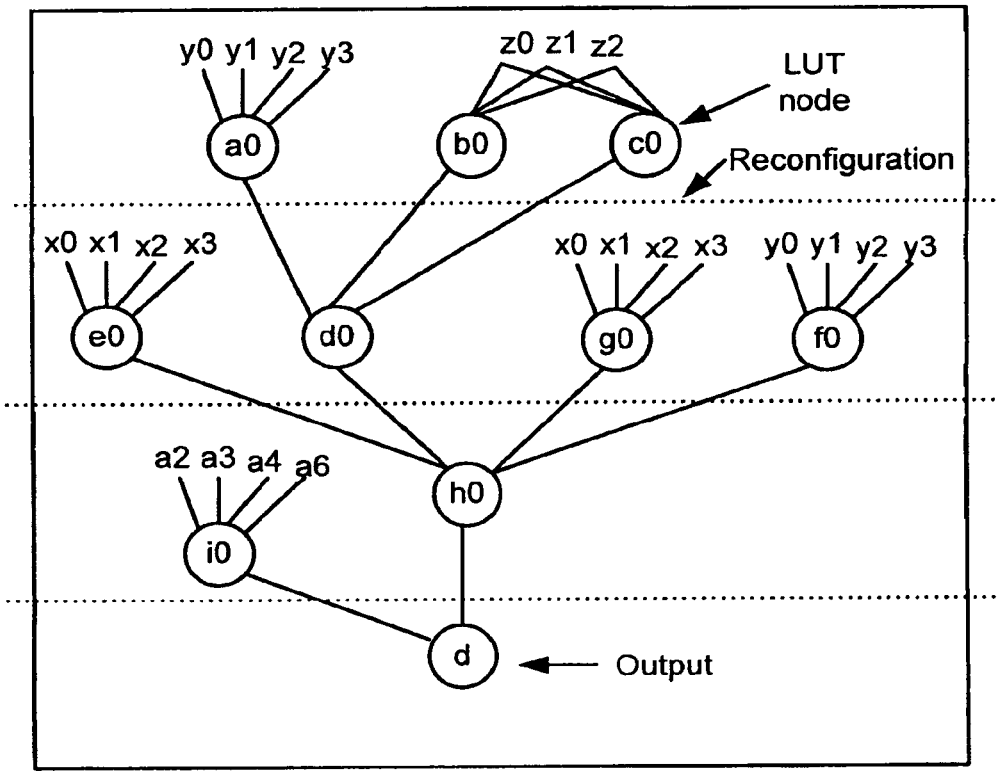
FIG. 7a illustrates level-1 temporal logic folding, and FIG. 7b level-2 temporal logic folding, in accordance with aspects of the present invention.
Figure 7B:
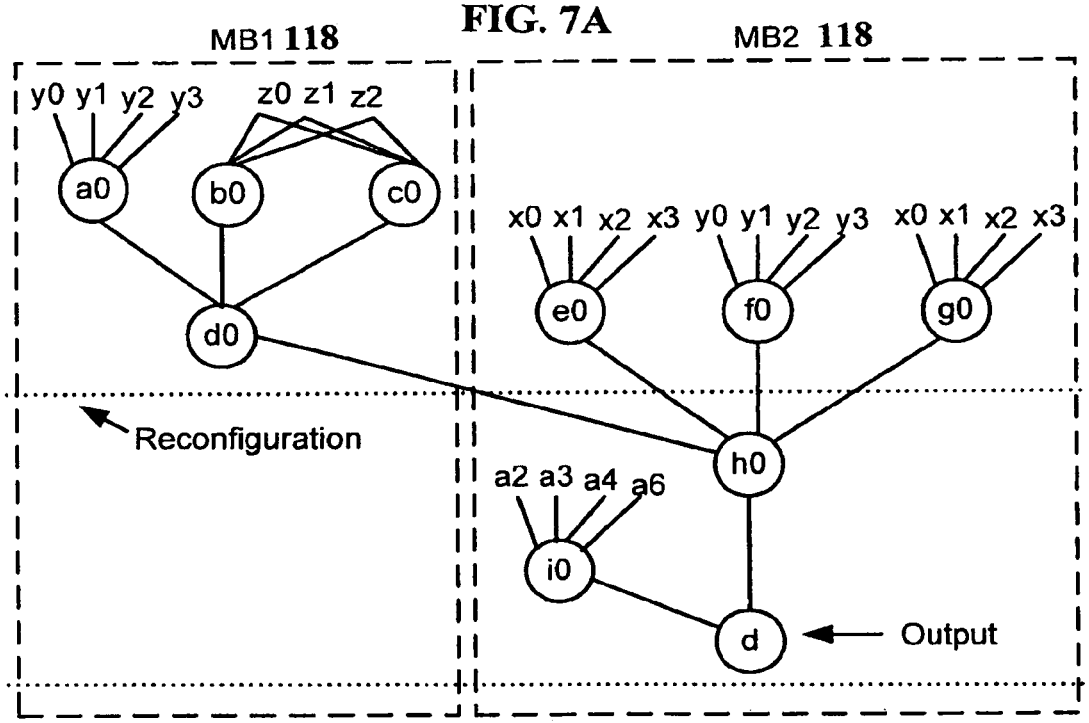

Logic folding can be performed at different levels of granularity, providing flexibility to enable area-performance trade-offs. As an example, consider the LUT graph (in which each node denotes a LUT) shown in FIG. 7(*a*), which denotes level-1 folding. Such a folding implies that the LEs are reconfigured after the execution of each LUT mapped to it. On the other hand, FIG. 7(*b*) shows level-2 folding, implying reconfiguration of the LE after execution of two LUT computations. A level-p folding can be similarly defined. The case of no folding corresponds to mapping of circuits to a traditional reconfigurable architecture in which spatial partitioning of the LUT graph is feasible, but not temporal folding.

There are various trade-offs involved in the choice of the folding level. First, when the folding level is large, the cycle period increases because a larger amount of computation is executed in one cycle. The number of LEs needed also increases since they are not fully time-shared. However, the total number of cycles decreases. This fact coupled with the reduction in reconfiguration time may reduce total circuit delay. However, this would generally be true when communications between LEs are still local in the folded circuit, usually within the range of several SMBs. If the area required for implementing the subcircuit is out of this range and long global communication is required in one cycle, then a small folding level may give better performance.

Another important advantage of logic folding occurs when the circuit is too large to fit into a traditional reconfigurable architecture; it could then be mapped into the architecture of the present invention with logic folding. In a situation where the number of available LEs is limited, factors considered for obtaining the best folding level may differ from those mentioned above. In such a case, the number of cycles required to execute the whole computation will be dependent on the number of computation nodes in the LUT graph divided by the number of available LEs. Hence, the best folding level might be one that best uses the available LEs. A smaller folding level will use LEs less efficiently, and require more cycles, while a larger folding level will increase the cycle period and result in time inefficiencies.

Experimental Results-NATURE

Various MCNC benchmarks and arithmetic circuits illustrate the benefits of the run-time reconfiguration and logic folding features of the present invention. Architectures of the present invention present a family of carbon nanotube RAM-based (and phase change RAM-based, magnetoresistive RAM-based, and ferroelectric RAM-based) reconfigurable architectures at different levels of granularity in terms of the number of LEs in an MB ($n_1$), number of MBs in an SMB ($n_2$), number of inputs per LE (m), number of configuration sets stored in the NRAM (k), etc. Accordingly, different architecture instances may be best suited for different circuit types. Since it appears that a cluster of four 4-input LUTs provides one of the best area-delay trade-offs, one embodiment of the present invention (for experimental purposes) uses an architecture instance corresponding to $n_1=4$, $n_2=4$, and m=4. Parameter k is varied in order to compare implementations corresponding to selected folding levels: level-1, level-2, level-4 and no logic folding (note that the number of carbon nanotube RAM bits increases as we go from no folding to level-4 folding and towards level-1 folding since the number of LE configurations increases).

Several small/middle sized benchmarks were manually mapped to the underlying architecture instance. The depth of the circuit LUT graph, number of LEs, circuit delay, product of number of LEs and delay (this is a proxy for the area-time product, which is reasonable since the present invention is a regular architecture), and frequency are shown, for different levels of folding, in Table I of FIG. 8. These results are based on 100 nm CMOS technology parameters.

Area/performance trade-offs that become possible because of use of logic folding are observed. Consider the 64-bit ripple-carry adder. Its LUT graph has 64 LUTs on the critical path. Using level-1 logic folding, the complete adder can be mapped to only two LEs. This, of course, requires reconfiguration of the LEs from the local carbon nanotube RAMs at each cycle. If more LEs are allowed (as in level-2, level-4 and no folding cases), the execution time goes down because fewer reconfigurations are required (note that, in this instance, the presence of a shadow SRAM is not assumed to overlap the reconfiguration and computation times of an LE—if assumed, the execution time for level-1 folding would go down by roughly 1.6× at the expense of a doubling of SRAM area). Traditional reconfigurable architectures will require 128 LEs for such an adder (some architectures incorporate a carry generation circuit with each LE; in such a case, they will require 64 LEs although each LE will be larger due to the carry generation circuit overhead) because they cannot perform any temporal logic folding. As the number of required LEs increases, the need for using higher-level (i.e., more global) interconnects to connect them also increases. This is one of the reasons traditional reconfigurable architectures are not competitive with ASICs in terms of performance.

Next, consider the area-time product. For larger, more serially-connected circuits of larger depth, the area-time product advantage of level-1 folding relative to no folding is typically larger. For example, for the 64-bit ripple-carry adder, it is observed that the advantage is about 34×. This results from a large saving in area while maintaining competitive performance.

Table I of FIG. 8 also illustrates that the present invention can operate at high frequency. Peak frequency is around 3.3 GHz. From level-1 folding to no-folding, the frequency decreases because increasingly more computation is included in one cycle period.

In spite of the fact that traditional reconfigurable architectures devote a vast majority of their area to interconnects, their LE utilization may not be high (an extremely large number of routing tracks may be needed to approach 100% LE utilization). Because of the cycle-by-cycle reconfiguration features of the architecture of the present invention, the LE utilization and relative logic density can be very high, with a reduced need for a deep interconnect hierarchy. Thus, architectures of the present invention suggest an evolutionary path for existing reconfigurable architectures, where fewer levels of interconnect hierarchy will be used and the area saved can provide for distribution of emerging non-volatile universal memories, such as carbon nanotube RAMs, throughout the chip.

A Discussion of Some Alternative NATURE Architectures

As discussed, NATURE can be characterized along a large number of varying dimensions, all of which are contemplated in the present invention. A non-exclusive list of exemplary characterizations are: 1) number of logic elements (LEs) per logic block; 2) number of inputs per LE; 3) size of carbon nanotube RAMs supporting each LE (this determines the granularity of reconfiguration); 4) depth of the FPGA interconnect hierarchy (localized communications can help drastically reduce this depth); 5) mix of different types of interconnects (much fewer longer interconnects are necessary); 6) number of registers per LE (because of the success of logic folding in reducing the number of LEs required for implementing the combinational logic by an order of magnitude, implementing sequential blocks now becomes the bottleneck for further area reduction); etc.

Figure 9:
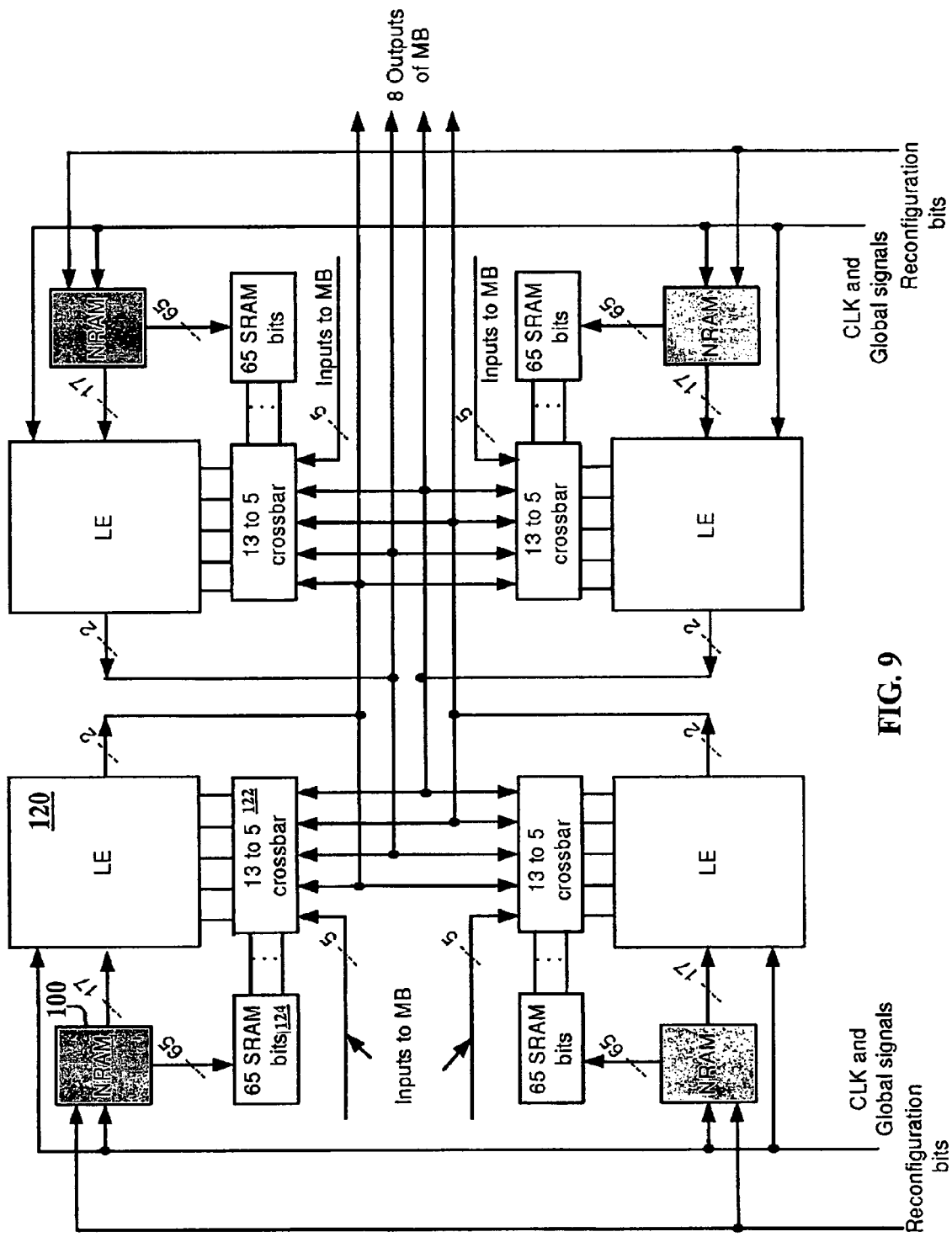
FIG. 9 illustrates an alternative architecture of a lower level MB of the present invention.
Figure 10:
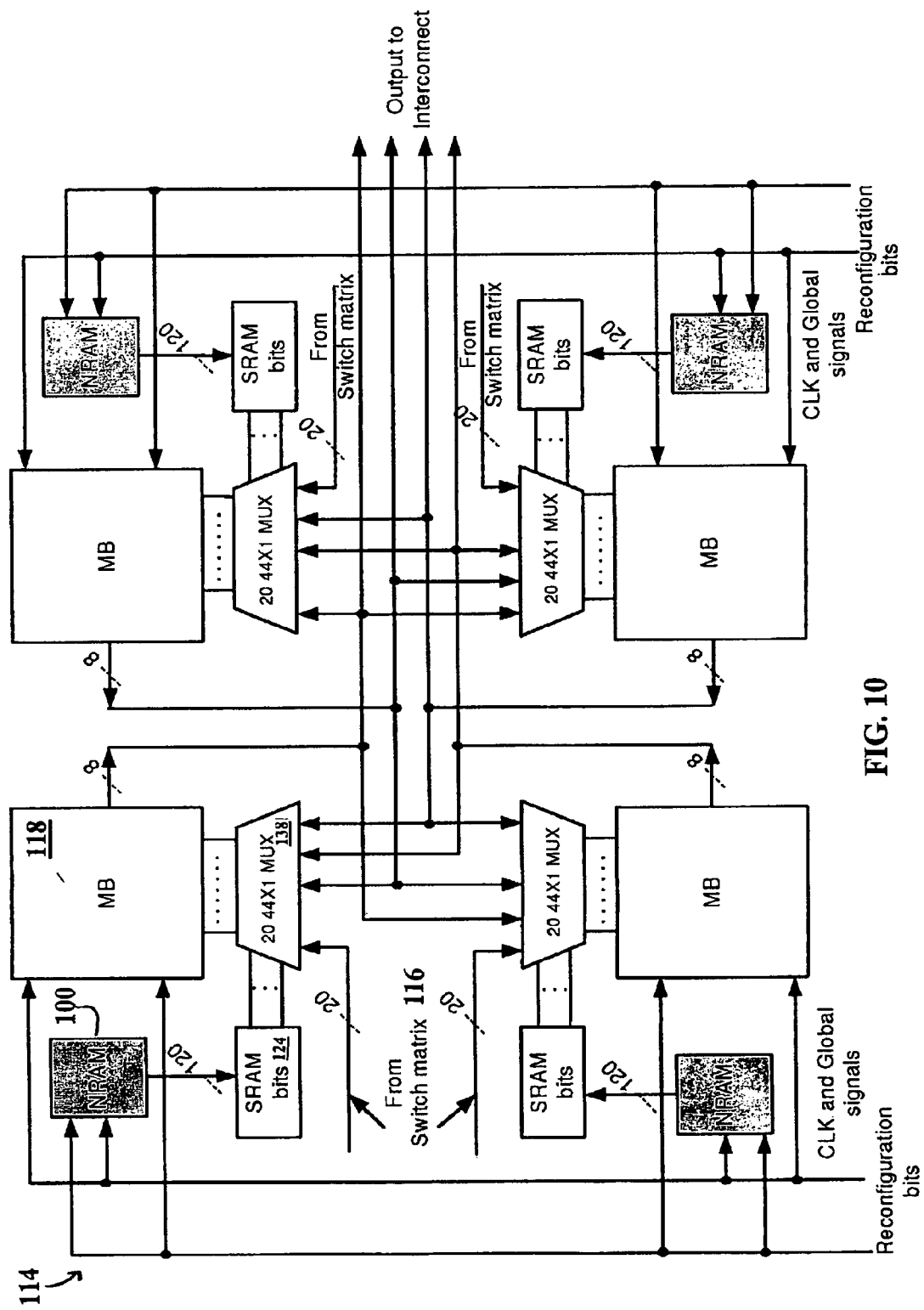
FIG. 10 illustrates an alternative architecture of a higher level SMB of the present invention.

For instance, as an extension of the high level architecture view of FIG. 2, consider an alternative embodiment SMB 114 architecture, as illustrated in FIGS. 9 and 10. The alternative SMB 114, in this embodiment, again includes two levels of logic. The first (i.e., lower) level, called the macroblock (MB) 118, is shown in FIG. 9. The MB 118 contains $n_1$ reconfigurable LEs 120 (in this embodiment, $n_1$=4). A 13 to 5 crossbar 122 is used to speed up the local communication. In the second (i.e, higher) level, $n_2$ MBs 118 comprise an SMB 114, as shown in FIG. 10 (in this embodiment, $n_2$=4). In this SMB 114, since many reconfiguration bits are necessary to configure a full crossbar 122, a multiplexer 138 is instead used for local communication. This architecture facilitates temporal logic folding of circuits and enables most inter-block communications to be local.

In the FIGS. 9 and 10 embodiments, the inputs of an MB 118 can arrive from other MBs 118 or the switch matrix 116. Similarly, the inputs of an LE 120 can arrive from other LEs 120 or MBs 118 or the switch matrix 116. The outputs from an LE 120 can be used within the MB 118 or go to the upper level SMB 114 or go to other SMBs 114 through the switch matrix 116.

Figure 11B:
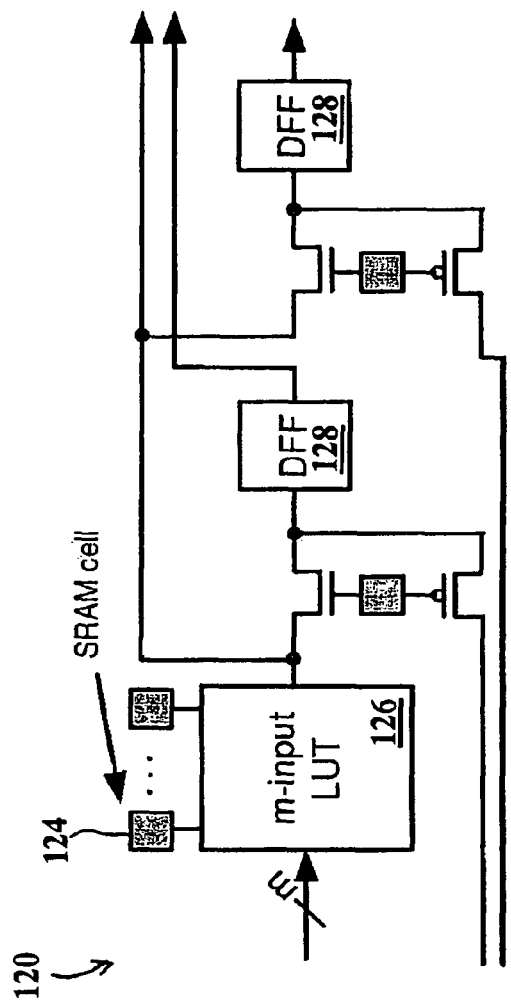
FIG. 11b illustrates another logic element (LE) architecture having two flip-flops.
Figure 11A:
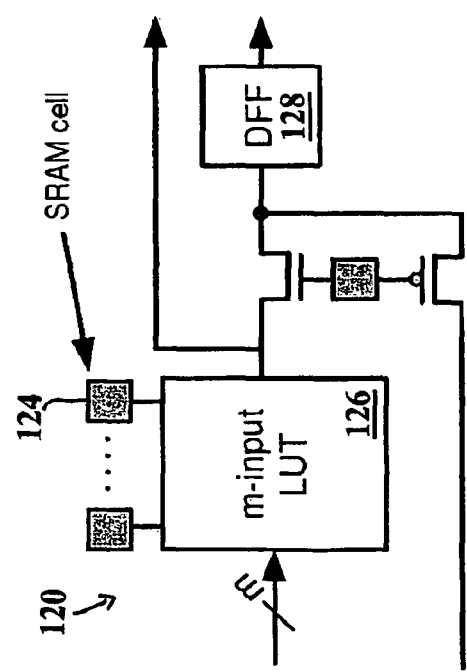
FIG. 11a illustrates a logic element (LE) architecture of the present invention having one flip-flop.

The inputs to the LE 120 include m inputs to a look-up table (LUT) 126 and one to a flip-flop 128, as shown in FIG. 11(a). In this embodiment, m=4. The flip-flop 128 can store the computation result from the LUT 126 (when a circuit is temporally folded, the result of a previous stage is often needed by a subsequent stage), or the value of a primary input. This gives the flexibility of storing a LUT computation result in the flip-flops 128 of other LEs 120. The m-input LUT 126 can implement any m-variable Boolean function.

To realize cycle-by-cycle logic reconfiguration capability, an carbon nanotube RAM 100 is again associated with each reconfigurable block (i.e., LE 120 or crossbar 122), to store the run-time reconfiguration bits. During reconfiguration, the reconfiguration bits are placed in the SRAM 124 cells to reconfigure the LE 120 or crossbar 122 to implement different logic functionality and interconnections. For example, if k configuration sets are stored in the carbon nanotube RAM 100, then k different logic functions can be realized within the same hardware resource without the need to access off-chip storage. For the MB 118 architecture shown in FIG. 9, 82 reconfiguration bits are required for a complete configuration set (when m=4). In this set, 16 bits are required for each 4-input LUT, and one bit for determining whether to store the internal result or not. Hence, when $n_1$=4, m=4, and k configuration sets are used, the total number of carbon nanotube RAM bits required for one MB 118 is $82kn_1$. A detailed layout and SPICE simulation show that a 16-set carbon nanotube RAM storage (i.e., k=16) introduces 10.6% area overhead with 160 ps on-chip reconfiguration time (i.e., the access latency of on-chip carbon nanotube RAM). Using this setup, the logic density is improved by 14× on average. In addition, logic folding constrains most communication to be local, which greatly reduces the need for global interconnect.

As a basis for relative discussions concerning other alternative NATURE architectures, the embodiment of FIGS. 9, 10 and 11(a) will be hereinafter referred to as the baseline design. That is, as detailed below, the baseline design describes an FPGA instance where the number of inputs per LE m=4, number of LEs per MB $n_1$=4, and number of MBs per SMB $n_2$=4, one LUT and one flip-flop per LE, and number of reconfiguration sets k=16.

Figure 12:
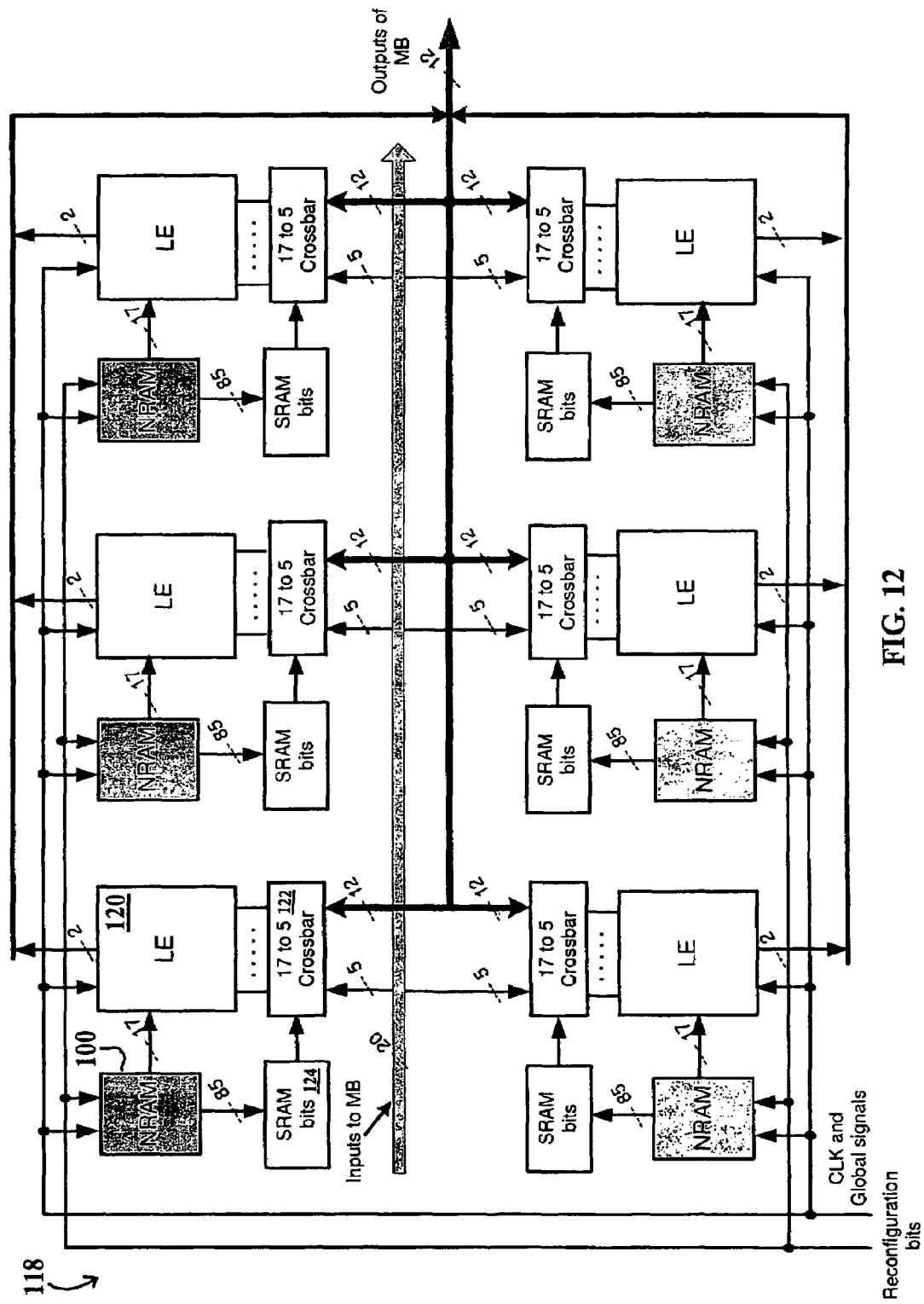
FIG. 12 illustrates still another architecture of a lower level MB of the present invention.
Figure 13B:
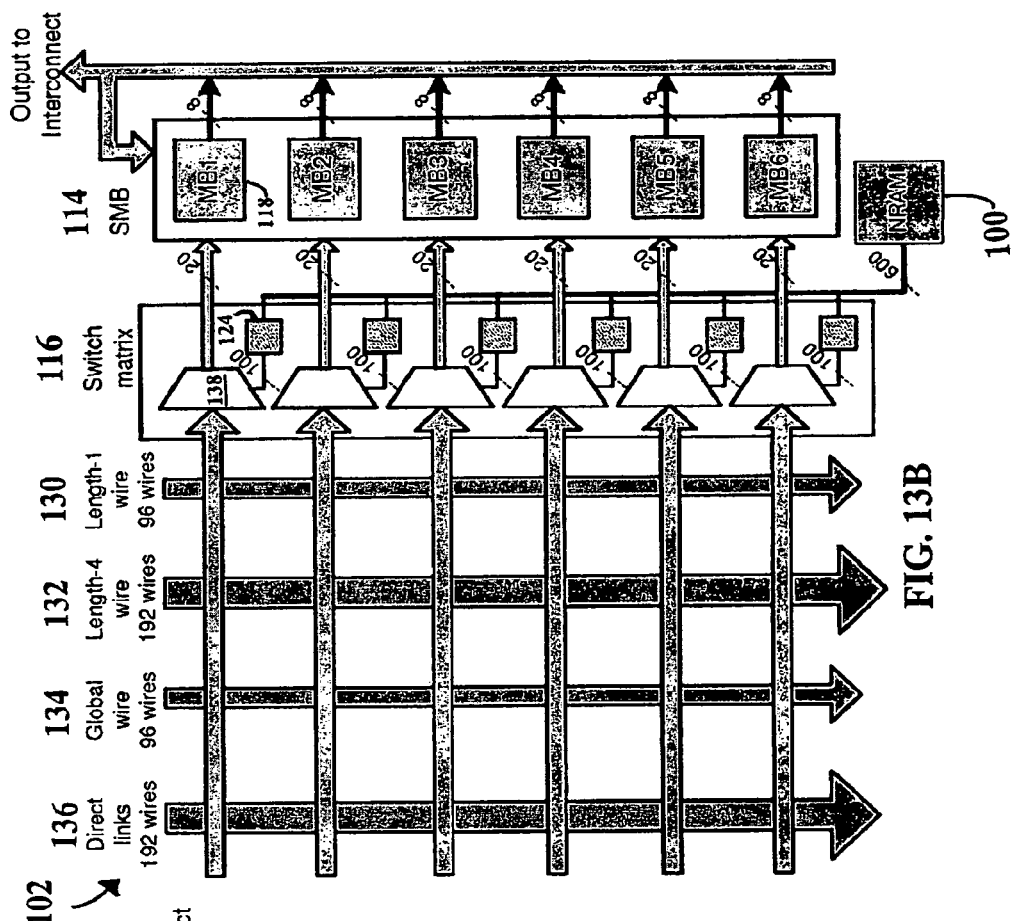
FIG. 13b illustrates a high-level view of a logic block (LB) architecture where the SMB has 6 MBs.
Figure 13A:
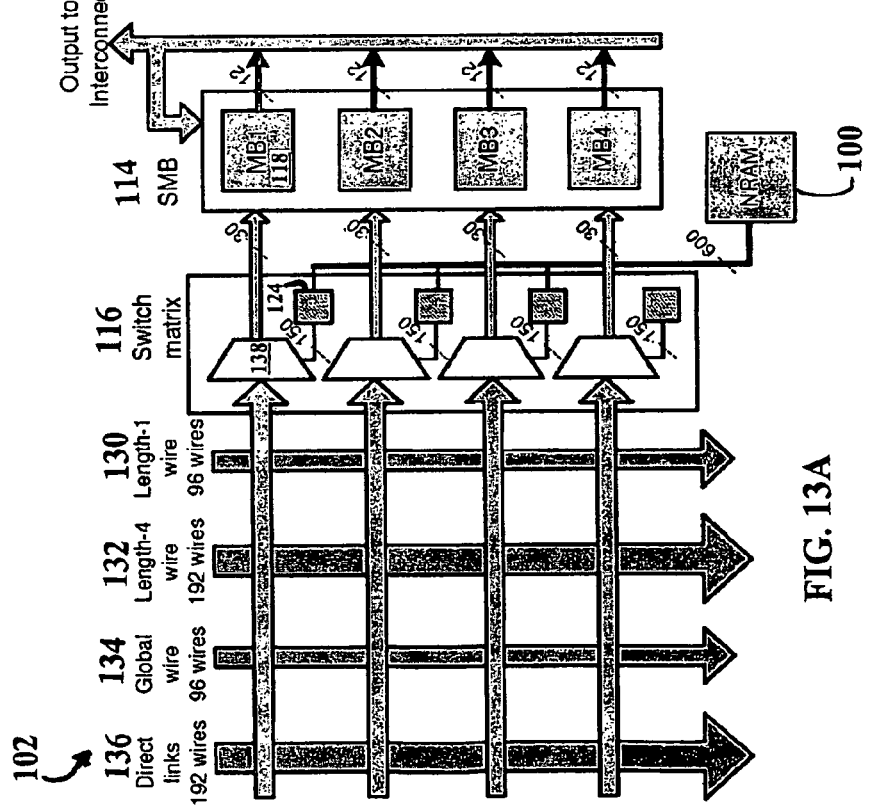
FIG. 13a illustrates a high-level view of a logic block (LB) architecture where a SMB has 4 MBs.

Number of LEs $n_1$ per MB: Changing the value of $n_1$ leads to area-delay trade-offs. For example, consider $n_1$=6, as shown in the exemplary embodiment of FIG. 12. This configuration leads to larger crossbars 122 within the MB 118, and a larger carbon nanotube RAM 100 to reconfigure it since more LE 120 outputs need to be connected to the crossbars 122. At the same time, more LEs 120 in an MB 118 increases the number of outputs from the MB 118. This also results in increases to both the size of the input multiplexers 138 to the MB 118, and the amount of interconnects associated with the MB 118, as shown in FIG. 13(a). In all, the area of an SMB increases by 1.9× for $n_1$=6, compared with $n_1$=4. Thus, relative area per LE goes up by 1.9/1.5=1.27×. The level of folding desired in a given application, and other area-delay constraints, will determine whether the increase in relative area per LE is advantageous.

Figure 14:
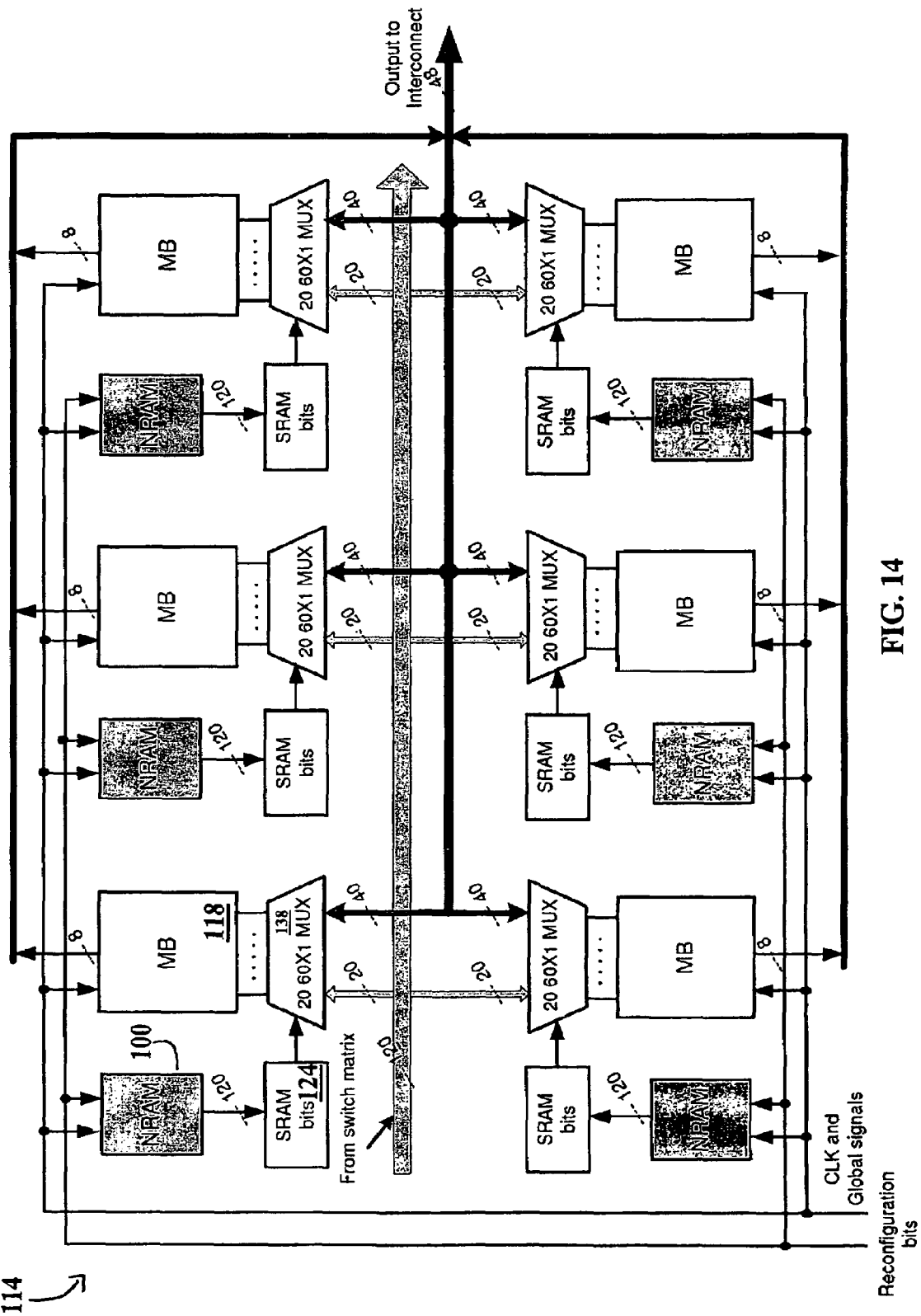
FIG. 14 illustrates still another architecture of a higher level SMB of the present invention.

Number of MBs $n_2$ per SMB: Varying $n_2$ will also result in area/delay trade-offs. Increasing $n_2$ allows more logic to be implemented in an SMB 114, and more local communications between MBs 118 within the SMB 114. Hence, circuit delay may be reduced. However, the area of the SMB 114 will increase correspondingly. Consider the case of $n_2=6$, as shown in the exemplary embodiment of FIG. 14, and for which the high-level LB 102 view is shown in FIG. 13(b). Since there are 1.5× more MBs, and the MB architecture is unchanged, the number of outputs of the SMB increases by 1.5×, in turn resulting in a 1.5× increase in the number of interconnect tracks necessary to connect all the SMB outputs while maintaining the same $F_c$ as the baseline design. Consequently, the size of the switch matrix will also increase since the inputs of the SMB will be selected from more interconnect tracks. When $n_2$ increases from four to six, the area of the LB again increases to 1.9×, and relative area per LE increases by 1.9/1.5=1.27×. Depending on the particular application, and respective level of folding, the corresponding reduction in circuit delay would need to be evaluated against the above-identified increase in relative area to determine if this embodiment is desirable.

Figure 15:
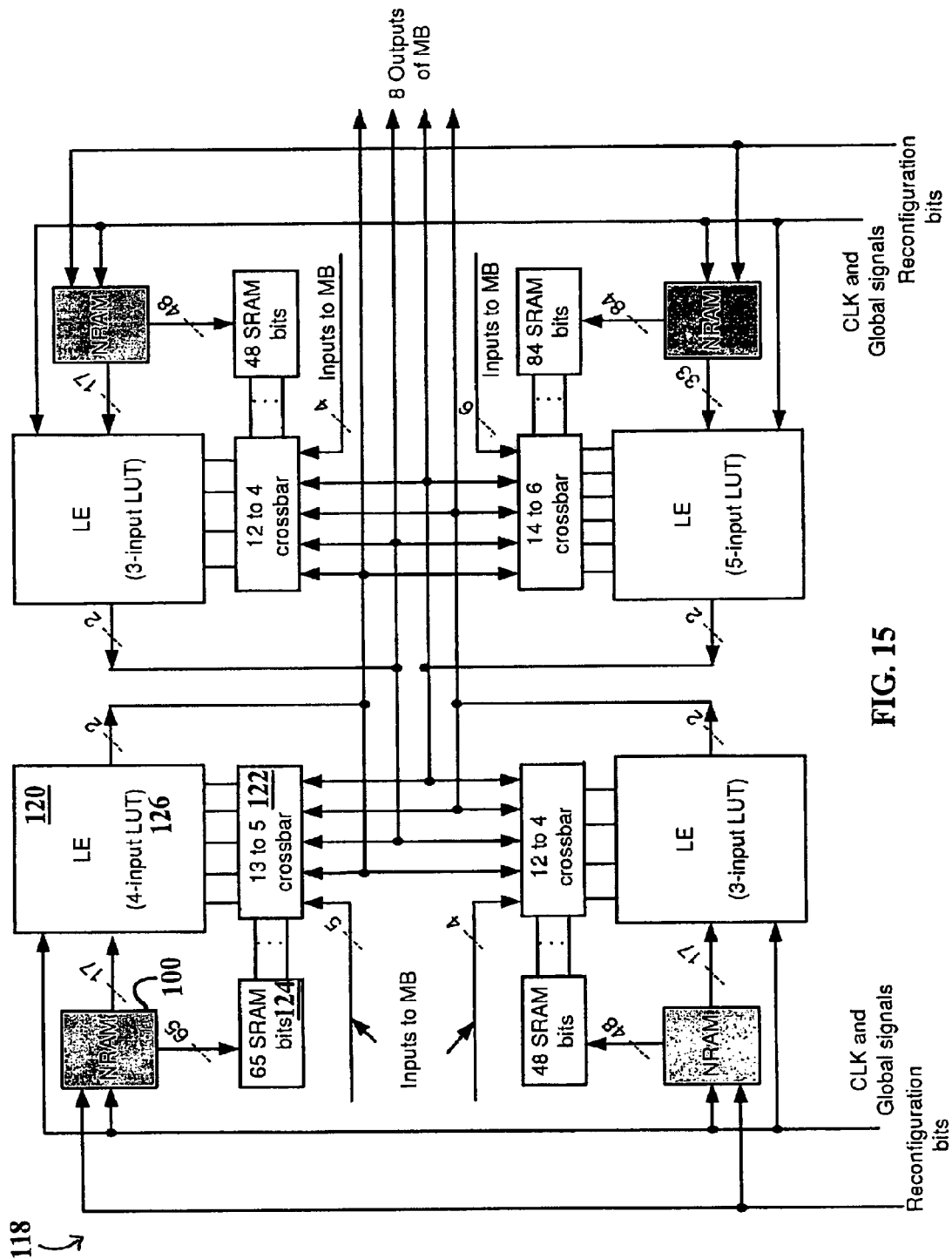
FIG. 15 illustrates a further architecture of a lower level MB of the present invention, where the number of inputs vary for any given LUT of each LE.

Number of inputs m per LUT: The number of inputs m for each LUT is a very important consideration for any FPGA architecture. If m is too large, and the application cannot always make use of all the inputs of each LUT, area is wasted. If m is too small, a larger number of LUTs are required and, therefore, more MBs, SMBs and more interconnect communications. For example, if m=5, the SMB area increases to 1.25×. In an instance where most LUTs only require four inputs, the mapped number of SMBs remains nearly the same. Hence, the mapped area increases by 1.25×. However, random logic (such as a controller) may benefit from a larger m. Because of the ability of FPGAs in the present invention to implement temporal logic folding, the value of m most suitable to conventional FPGAs may not be the same as in the present invention. Further, depending on the application, and desired folding level, the present invention contemplates that different inputs can exist for any given LUT 126 for each LE 120 of a MB 118. An exemplary embodiment is shown in FIG. 15.

Number of flip-flops per LE: Since temporal logic folding may reduce the combinational logic by more than an order of magnitude, the number of registers in the circuit may now become the bottleneck of further area reduction. Thus, as opposed to traditional LEs that include only one flip-flop, the present invention includes embodiments having more flip-flops per LE to further reduce the number of LEs required. However, if the inputs to the flip-flops are separately accessed, the number of inputs/outputs of an LE will increase as the number of flip-flops in an LE increases. Then, as discussed above, the communication network within and outside the SMB may grow very fast due to the increase in the number of inputs/outputs per LE, MB and SMB. Hence, the SMB size may increase significantly. If flip-flops in each LE are not used efficiently, area may be wasted.

For example, assume two flip-flops 128 per LE 120 as shown in FIG. 11(b). The input for each flip-flop 128 is distinct in this embodiment, providing that different values are stored in each of the two flip-flops 128 at the same time. This arrangement results in an increase: 1) in the size of the crossbar 2 in an MB 118; in the size of the input multiplexer 138 in an SMB 114; and 3) in the number of inputs to each SMB 114. The area of the SMB thereby increases by 1.5×.

In an instance of level-1 folding with configuration sets k=16, significant area savings were realized (i.e., reduced number of LEs). However, increasing the number of flip-flops to three per LE could result, in the same instance, in an area increase. Since area saving depends on the value of k, simultaneously consideration of these two parameters are necessary.

Number of reconfiguration sets k: The value of k determines the amount of logic folding possible. If k is too small, more LEs are needed to perform a mapping. If k is too large, use of the extra configurations may not be possible, thus resulting in wasted carbon nanotube RAM area that could have been put to other use. Complicating this fact is that the best value of k varies with a change in the optimization objective (e.g., area, delay or area-delay product).

Figure 16:
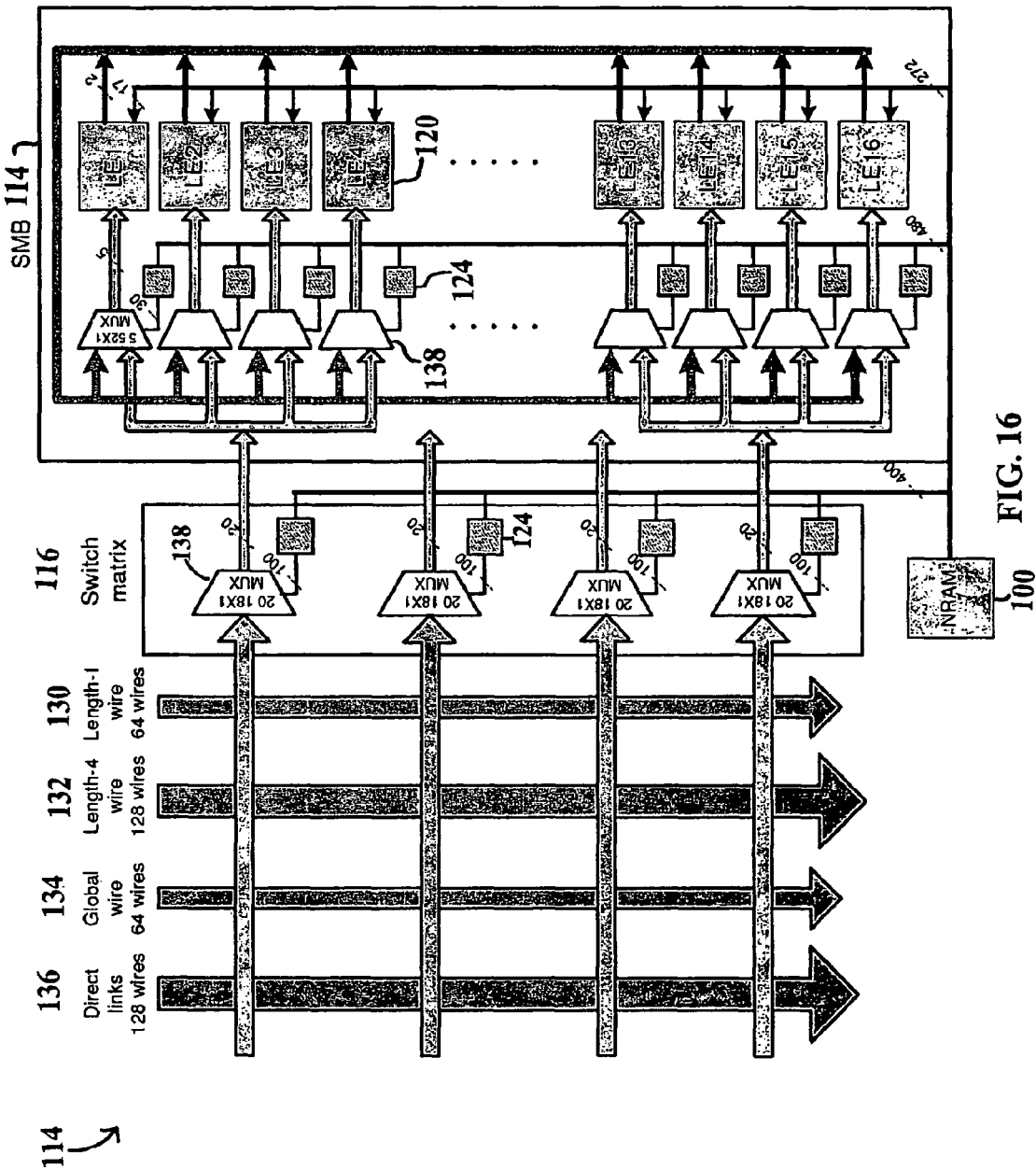
FIG. 16 illustrates a SMB architecture with one level of folding in accordance with the present invention.

Number of logic levels per SMB: In the baseline design, two levels of logic are used in an SMB (i.e., SMB→MB and MB→LE) to facilitate local communication. However, since any communication between two LEs in different SMBs has to traverse two levels of interconnect, the communication delay is larger compared with that within just one level of logic. In addition, a two-level logic structure requires more implementation area than a one-level logic structure. Hence, a one-level structure has an advantage in area and inter-SMB delay, but a disadvantage in intra-SMB delay. FIG. 16 shows the structure of a flattened SMB 114 with one level of logic. An input of an LE 120 is now directly selected from the inputs from the switch matrix 116 and the outputs of other LEs 120. In the FIG. 16 embodiment, area is reduced by 1.1×.

Interconnect parameters: In the carbon nanotube RAM-based FPGAs of the present invention, inter-LE communications become much more local. Hence, the interconnect hierarchy can be sharply reduced. Currently, the baseline sets Fc=W/N and Fs=6, where N is the number of LEs in an SMB and W is the number of interconnect tracks per channel. A larger Fc and Fs can provide more routing flexibility, but at the cost of more routing area. The values for Fc and Fs can also be varied to achieve an optimal trade-off between routability and area efficiency.

Figure 17:
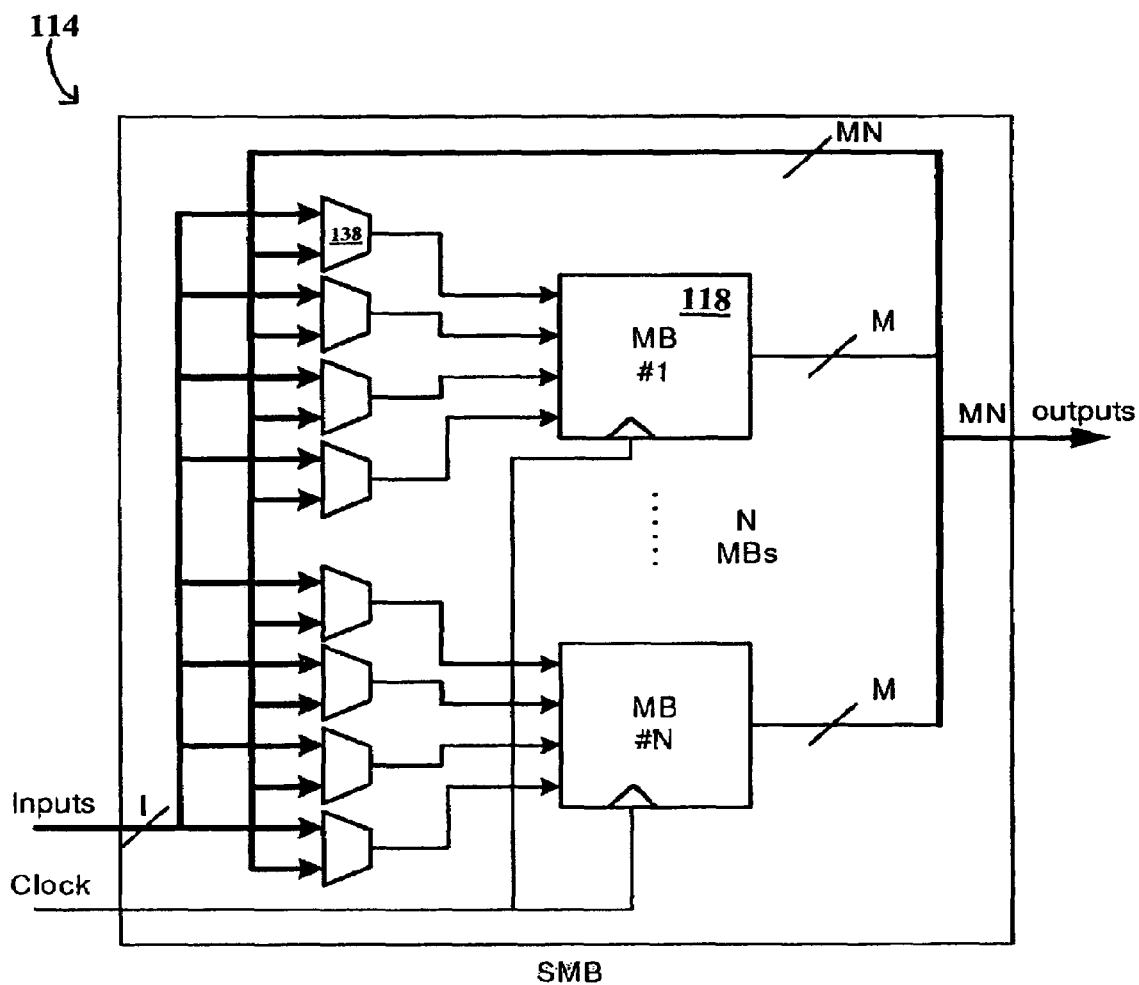
FIG. 17 illustrates routing about a general SMB structure including from one to n MBs.

Moreover, in most embodiments of the present invention, every input in the SMB 114 is accessible from the interconnect, with full routability within an SMB 114. However, complete routability within an SMB 114 may not be necessary. Both I and M (see FIG. 17) could potentially be reduced while keeping LE usage high, to thereby reduce the size of input multiplexers 138 in an SMB 114. Since multiplexers 138 contribute most to the area of an SMB 114, multiplexer size could result in a reduction in the size of an LB 102. For example, if I=0.6 and M=1 (i.e., full routability assumed within the SMB), the size of the LB 102 reduces to 76%.

NanoMap Design Optimization

The present invention also provides an integrated design optimization platform for NATURE, referred to as NanoMap. NanoMap conducts design optimization from the RTL down to the physical level. Given an input design specified in RTL and/or gate-level VHDL, NanoMap optimizes and implements the design on NATURE through logic mapping, temporal clustering, placement, and routing. The design optimization techniques of the present invention exploit the design flexibilities enabled by fine-grain temporal logic folding. Given user-specified area and performance constraints, the mapping method and system of NanoMap can automatically explore and identify the best logic folding configuration, and make appropriate tradeoffs between performance and area efficiency. The methods of the present invention can be implemented as software running on a general-purpose computer, such as an INTEL® PENTIUM® based personal computer running a MICROSOFT® WINDOWS® operating system, although the invention is not limited to that particular implementation.

To demonstrate the design optimization flow of NanoMap, an example RTL circuit 140 will be provided, and concepts associated therewith are first introduced for ease of exposition. Given an RTL circuit 140, the registers contained therein are first levelized. The logic between two levels of registers is referred to as a plane. The registers associated with the plane are called plane registers. The propagation cycle of a plane is called plane cycle. Using temporal logic folding, each plane is further partitioned into folding stages. Resources can be shared among different folding stages within a plane or across planes. The propagation cycle of a single folding stage is defined as folding cycle. Note that different planes should consist of the same number of folding stages to guarantee global synchronization. Thus, the key issue is to determine how many planes are folded together and to determine the appropriate folding level (i.e., the number of folding stages in one plane necessary to achieve the best area-performance tradeoff under specified design constraints).

FIG. 18(a) shows an example comprising a four-bit controller-datapath consisting of a single plane. The controller consists of flip-flops s0 and s1, and LUTs LUT1-LUT4. The datapath consists of registers reg1-reg3, a ripple-carry adder and parallel multiplier module, requiring in all 100 LUTs and 14 flip-flops. The ripple-carry adder consists of eight LUTs with a logic depth (i.e., the number of LUTs along the critical path) of four. The parallel multiplier consists of 38 LUTs with a logic depth of seven. The control logic consists of four LUTs. Suppose the optimization objective is to minimize circuit delay under a total area constraint of 20 LEs. We assume each LE contains one LUT and two flip-flops. Hence, 20 LEs equal 20 LUTs along with 40 flip-flops. Since the number of available flip-flops is more than required, we concentrate on the LUT constraint.

The present invention uses an iterative optimization flow. As a smaller number of folding stages leads to better performance, NanoMap starts with a guessed folding level, resulting in a minimal number of folding stages under the given area constraint, and gradually refines it. In the FIG. 18 example, the minimal number of folding stages is equal to the total number of LUTs divided by the LUT constraint, |50/20|=3 (i.e., at least three folding stages are required to meet the LUT constraint). The folding level is obtained by the maximum logic depth divided by the number of folding stages, which equals |4+7/3|=4.

Next, based on the chosen folding level, the adder and multiplier modules are partitioned into a series of connected LUT clusters in a way that if the folding level is p, then all the LUTs at a depth less than or equal to p in the module are grouped into the first cluster, all the LUTs at a depth larger than p but less than or equal to 2p are grouped into the second cluster, and so on. The LUT cluster can be considered in its entirety with its logic depth being less than or equal to the folding level. This implies that one LUT cluster can be executed within one folding cycle, thereby being contained in one folding stage. By dealing with LUT clusters instead of a group of single LUTs, the logic mapping procedure can be greatly sped up. FIG. 18(b) shows the partition for the multiplier module 142 with level-4 folding. However, note that the first LU1 cluster of the multiplier already needs 32 LUTs, exceeding the area constraint. Thus, the folding level has to be further decreased to level-2 to guarantee that each LUT cluster can be accommodated within the available LEs. Correspondingly, the number of folding stages increases to six.

Next, after choosing a suitable folding level, Force Directive Scheduling (FDS) is used to determine the folding cycle assignment of each LUT and LUT cluster to balance the resource usage across the six folding stages. If the number of LUTs and flip-flops required by every folding stage is below the area constraint (i.e., 20 LEs) the solution is valid and offers the best possible performance. Otherwise, the folding level is reduced by one, followed by another round of optimization. This process continues until the area constraint is met, assuming the area constraint can be satisfied.

FIG. 18(c) illustrates the mapping result 144 for level-2 folding for the first three folding stages of the total of six folding stages. Note that plane registers, which provide inputs to the plane, need to exist through all the folding stages in the plane. The first folding cycle requires 14 LEs. Four LEs are required for mapping LUT cluster 1 of the adder, which is depicted as add: c1 in FIG. 18(c). Flip-flops s0 and s1 are mapped to the available flip-flops inside the LEs assigned to adder cluster 1. Four LEs are also required for LUT1-LUT4 computation, and to store the respective computation results. The four-bit registers, reg1, reg2 and reg3, need two LEs each to accommodate their four flip-flops. Similarly, in folding cycle 2, four LEs are needed for adder cluster 2 computation and resulting storage. Four LEs are required for maintaining the LUT1-LUT4 computation results, which need to be preserved until folding cycle 6 to control the loading of registers, and six LEs for reg1-reg3. Folding cycle 3 requires the maximum number of LEs, since multiplier cluster 1 needs 16 LUTs, which occupy 16 LEs. The number of LEs needed by the last three folding levels (not shown), are 16, 12 and 12, respectively. Hence, the number of LEs for mapping this RTL circuit is the maximum required across all the folding cycles (i.e., 16). This is within the area constraint.

Next, clustering, which groups LEs into SMBs, placement and routing are performed to produce the final layout of the implementation and obtain the best possible circuit delay under the given constraint. When performing clustering, inter-stage relationships are honored, since some computation results need to be preserved through several folding cycles. Once the results are assigned to some flip-flops in an SMB, they are not assigned to other SMBs in other folding cycles. In the FIG. 18 example, assume there are four LEs in an MB and four MBs in an SMB. Thus, the 14 LEs in folding cycle 1 can be accommodated into one SMB. Suppose LUT1-LUT4 are assigned to MB1. Then their computation results storage 1-4 will be present in MB1 through all the folding cycles before being overwritten by new results.

Automated Optimization Flow of NanoMap

Figure 19:
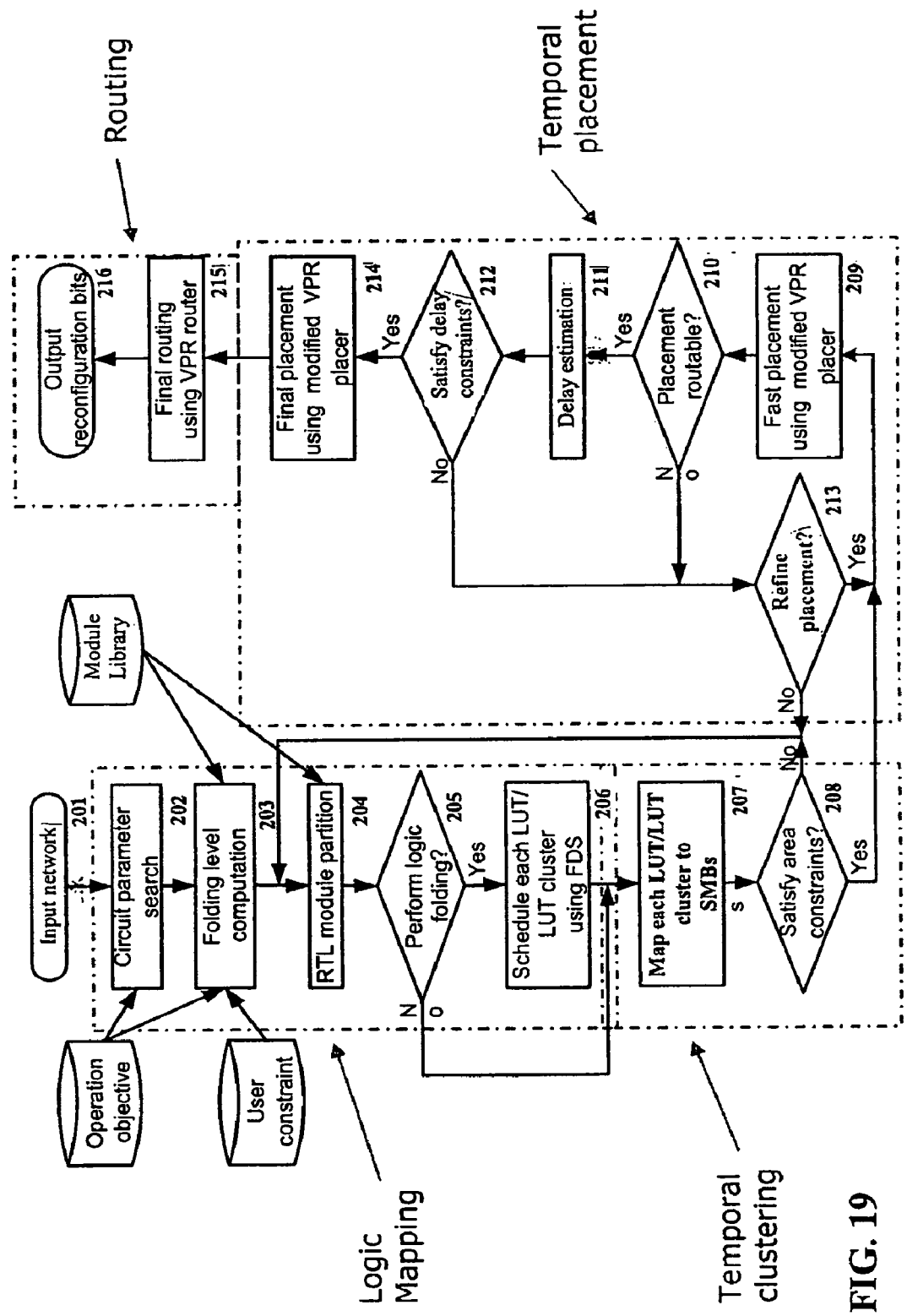
FIG. 19 is a flow diagram illustrating a design optimization method and system of the present invention, referred to as NanoMap.

FIG. 19 illustrates an integrated design optimization flow for NATURE. Given an input design 201 specified in mixed RTL and gate-level VHDL, NanoMap conducts logic mapping, temporal clustering, temporal placement and routing, and produces a configuration bitmap for NATURE.

Logic Mapping: (Steps 202-206) Steps 202-206 of FIG. 19 use an iterative approach to identify the best folding level based on user-specified design constraints, optimization objectives, and input circuit structure. FDS techniques, detailed below, are used to assign LUTs and LUT clusters to folding stages and balance inter-folding stage resource usage, and to produce the LUT network of each temporal folding stage.

Temporal Clustering: (Steps 207-208) Steps 207-208 of FIG. 19 take the flattened LUT network as input, and cluster the LUTs into MBs and SMBs to minimize the need for global interconnect, and to simplify placement and routing. As opposed to the traditional clustering problem, each hardware resource (i.e., LE, MB, or SMB) is temporally shared by logic from different temporal folding stages. Temporal folding necessitates that both intrastage and inter-stage data dependencies be jointly considered during LUT clustering. Folding stages need not be limited to one plane; temporal clustering can span planes. After clustering, verifying satisfaction of the area constraint is performed. If the area constraint is satisfied, placement is invoked. Otherwise, NanoMap returns to logic mapping.

Temporal Placement: (Steps 209-214) Steps 209-214 of FIG. 19 perform physical placement and minimize the average length of inter-SMB interconnects. Physical placement and interconnect minimization is implemented on top of VPR, an FPGA place-and-route tool, detailed and referenced below, to provide inter-folding stage resource sharing. Placement is performed in two steps. First, a fast placement is used to derive an initial placement. A low-precision routability and delay analysis is then performed. If the analysis indicates success, a detailed placement is invoked to derive the final placement. Otherwise, several attempts are made to refine the placement and if the analysis still does not indicate success, NanoMap returns to logic mapping.

Routing: (Step 215) Step 215 of FIG. 19 uses the VPR router to generate intra-SMB and inter-SMB routing. After routing, the layout for each folding stage is obtained and the configuration bitmap generated 216 for each folding cycle.

The following details the above steps. For logic mapping, focus is provided on folding level determination and FDS technique.

Choosing the Folding Level

The folding level choice is critical to achieving the best area-performance tradeoff. As previously noted, the best folding level depends on input circuit structure, obtained by identifying each plane and obtaining the circuit parameters within each plane. The following outlines the necessary circuit parameters:

Number of planes in input circuit: num_plane

Number of LUTs in plane i: num_LUT$_i$

Logic depth of plane i: depth$_i$

Maximum number of LUTs among all the planes:
   LUT_max=max(num_LUT$_i$) for i=1, . . . , num_plane Maximum logic depth among all the planes:
   Depth_max=max{depth$_i$} for i=1, . . . num_plane Area constraint, e.g., the available number of LEs: available_LE Number of reconfiguration copies in each carbon nanotube RAM: num_reconf Given the specified optimization objective and constraint (e.g., circuit delay minimization under area constraint or area minimization under delay constraint, etc.), the best folding level is computed using above parameters. The following details a targeting of one of the design objectives. Similar procedures can target other objectives.

Suppose the optimization goal is to minimize circuit delay. If there is no area constraint, we can use no-folding to obtain the shortest delay. If an area constraint is given, it is satisfied first, then the best possible delay obtained. There are two scenarios considered:

1) Multiple planes are allowed to share resources: Since circuit delay is equal to plane cycle times the number of planes in the circuit, plane cycle has to be minimized under the area constraint. First, all the planes together are stacked (i.e., resources are shared across all planes, since this does not increase circuit delay but reduces area). Suppose the area used up at this point is LUT_max. If LUT_max is larger than available_LE, logic folding is required to reduce the area within each plane. The minimum required number of folding stages within each plane is given by:

$$\#\text{folding\_stages} = \left\lceil \frac{\text{LUT\_max}}{\text{available\_LE}} \right\rceil \quad (1)$$

Since the number of folding cycles should be kept the same in each plane, maximum logic depth is used to compute the folding level:

$$\text{folding\_level} = \left\lceil \frac{\text{depth\_max}}{\#\text{folding\_stages}} \right\rceil \quad (2)$$

Using the chosen folding level, the present invention uses FDS and temporal clustering to obtain the area required. If the area constraint is not satisfied, the folding level is decreased by one. NanoMap then iterates until the area constraint is met or the folding level reduces to the minimum allowed, min_level, which is limited by num_reconf:

$$\text{min\_level} = \left\lceil \frac{\text{depth\_max} * \text{num\_plane}}{\text{num\_reconf}} \right\rceil \quad (3)$$

Figure 20:
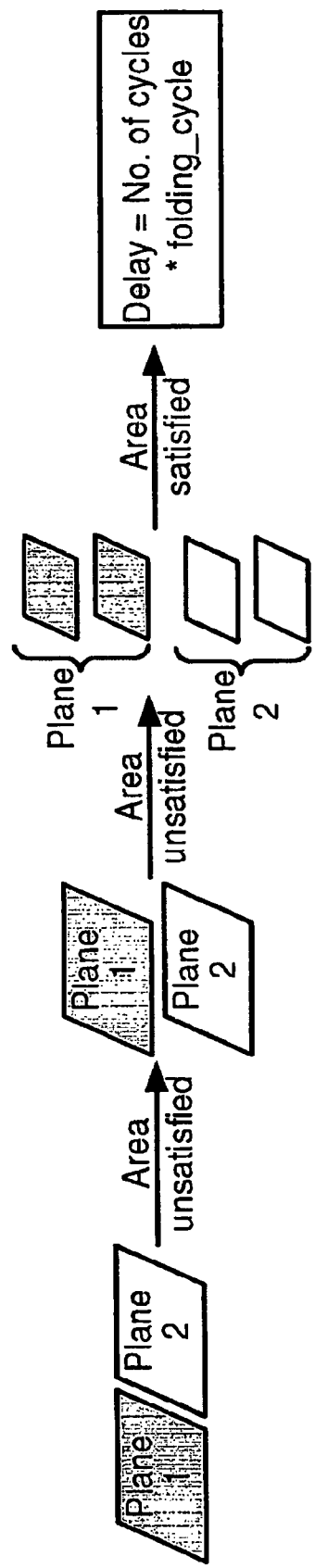
FIG. 20 illustrates delay optimization procedure under area constraint, assuming across-plane resource sharing, to choose folding level.

FIG. 20 illustrates the optimization procedure.

2) Multiple planes are not allowed to share resources: Such a scenario is possible if the RTL circuit is pipelined and, hence, the different pipeline stages need to be resident in the FPGA simultaneously. In this scenario, temporal logic folding can only be performed within each plane. Then the folding level requested can be directly computed by the following equation:

$$\text{folding\_level} = \left\lceil \frac{\text{depth\_max} * \text{available\_LE}}{\sum_i \text{num\_LUT}_i} \right\rceil \quad (4)$$

After an appropriate folding level is chosen, the RTL module is partitioned into LUT clusters accordingly. The original mixed module/LUT network is transformed to an equivalent LUT/(LUT cluster) network which is fed to FDS.

Force-Directed Scheduling (FDS)

Different folding stages share the same set of LEs temporally. Overall LE use is then determined by the folding stage using the maximum number of LEs. To optimize overall resource use in each plane, a modified Force-Deflected Scheduling (FDS) method is implemented to assign the LUT or LUT cluster to folding stages and balance the resource use of the folding stages.

Force-Deflected Scheduling (FDS) is described in the following, which is incorporated herein by reference for its useful background information:
   P. G. Paulin and J. P. Knight, "Force-Directed Scheduling for the Behavioral Synthesis of ASIC's," *IEEE Trans. Computer-Aided Design*, vol. 8, pp. 661-679, June 1989.

FDS is a popular scheduling technique in high-level synthesis. However, the present invention uses FDS in another scenario. FDS uses an iterative approach to determine the schedule of operations, to minimize overall resource use. The resource use is modeled as a force. The scheduling of an operation to some time slot, which results in the minimum force, indicates a minimum increase in resource use. The force is calculated based on distribution graphs (DGs), which describe the probability of resource use for a type of operation in each time slot.

In the present invention, since the LE use in each folding cycle is dependent on both the LUT computations and register storage operations conducted in parallel, two DGs must be assembled: one describing the resource use of the LUT computation; and another for register storage use. The following details: 1) how DGs are created; and 2) how forces are calculated based on the two created DGs.

1) Creation of DGs: First, to build the LUT computation DG, the time frame of each LUT or LUT cluster needs to be determined. For a LUT or LUT cluster i, its time frame time_frame$_i$, or feasible time interval, is defined as the span from the folding cycle it is assigned to in the ASAP schedule to the folding cycle it is assigned to in the ALAP schedule. From the ASAP/ALAP schedules shown in FIG. 21 for the ongoing example, we can see that time frame$_{LUT2}$ spans folding cycles 1 to 3. Here, clus$_i$ denotes LUT cluster i. If a uniform probability distribution is assumed, the probability that this computation is assigned to a feasible folding cycle j within its time frame equals 1/|time_frame$_i$| for j∈time_frame$_i$.

Following a definition similar to that given by P. G. Paulin and J. P. Knight, above, a LUT computation DG models the aggregated probability distribution of the potential concurrency of N LUT/(LUT cluster) computations within each folding cycle j, whose value LUT_DG(j) is the sum of the probabilities of all the computations assigned to this folding cycle, as follows:

$$\text{LUT\_DG}(j) = \sum_{i=1}^{N} \frac{1}{|\text{time\_frame}_i|} * weight_i, \; j \in \text{time\_frame}_i$$

where weight$_i$ is one for a LUT and equal to the number of LUTs in a LUT cluster.

To build the register storage DG, which models the distribution of register storage usage, a procedure similar to that of P. G. Paulin and J. P. Knight, above, is adopted. A storage operation is created at the output of every source computation that transfers a value to one or more destination computations in a later folding cycle. If both the source and destinations of a storage operation are scheduled, the distribution of the storage operation equals its lifetime, which begins from the folding cycle of the source and ends at the folding cycle of the last destination. Here, it is assumed the results are stored at the begining of each folding cycle. If one or more of the source or destinations are not scheduled, a probabilistic distribution is obtained.

The following heuristic is used to quickly estimate the resulting storage distribution. First, ASAP_life and ALAP_life of a storage operation are defined as its lifetime in the ASAP and ALAP schedules, respectively. For example, in FIG. 22, the output of source computation LUT2 is denoted as storage S. S transfers the value to destination computation LUT3 and LUT4. In the ASAP schedule, S begins at folding cycle 2 and ends at folding cycle 3. Hence, ASAP_life$_S$=[2, 3] and the length of ASAP_life: |ASAP_life$_S$|=2. Similarly, in the ALAP schedule, S begins at folding cycle 4 and ends at folding cycle 4, which results in |ALAP_life$_S$|=1.

The longest possible lifetime max_life for the storage operation is the union of its ASAP_life and ALAP_life, whose length is obtained as:

|max_life|=(ALAP_life end−ASAP_life_begin+1)  (6)

For the ongoing example, S begins in folding cycle 2 in the ASAP schedule (i.e., ASAP_life_begin$_S$=2). Its lifetime ends in cycle 4 in the ALAP schedule (i.e., ALAP_life_end$_S$=4). Thus, the length of the maximum lifetime for S (e.g., |max_life$_S$=3).

If ASAP_life overlaps with ALAP_life, the overlap time, overlap, is the intersection of ASAP_life and ALAP_life, whose length is similarly obtained as:

|overlap|=(ASAP life end−ALAP life begin+1)  (7)

Within the overlap time, a storage operation must exist with probability 1. For the example, there is no overlap time for S. Then an estimate of the average length of all possible lifetimes can be obtained by:

$$\text{avg\_life} = \frac{|\text{ASAP\_life}| + |\text{ALAP\_life}| + |\text{max\_life}|}{3} \quad (8)$$

Next, the probability of a storage operation performed for a LUT or LUT cluster computation i in folding cycle j can be calculated as follows:

when j is outside of overlap$_i$ and j∈max_life$_i$:

$$storage_i(j) = \frac{\text{avg\_life}_i - |overlap_i|}{|\text{max\_life}_i| - |overlap_i|} * weight_i \quad (9)$$

when j is within overlaps, which means a storage operation must be performed:

storage$_i$(j)=weight$_i$  (10)

The process is carried out for all the storage operations, and the separate probabilities due to N LUTs and LUT clusters in folding cycle j are added to obtain a single storage DG as follows:

$$\text{storage\_DG}(j) = \sum_{i=1}^{N} storage_i(j) \, j \in \text{max\_life}_i \quad (11)$$

Figure 21B:
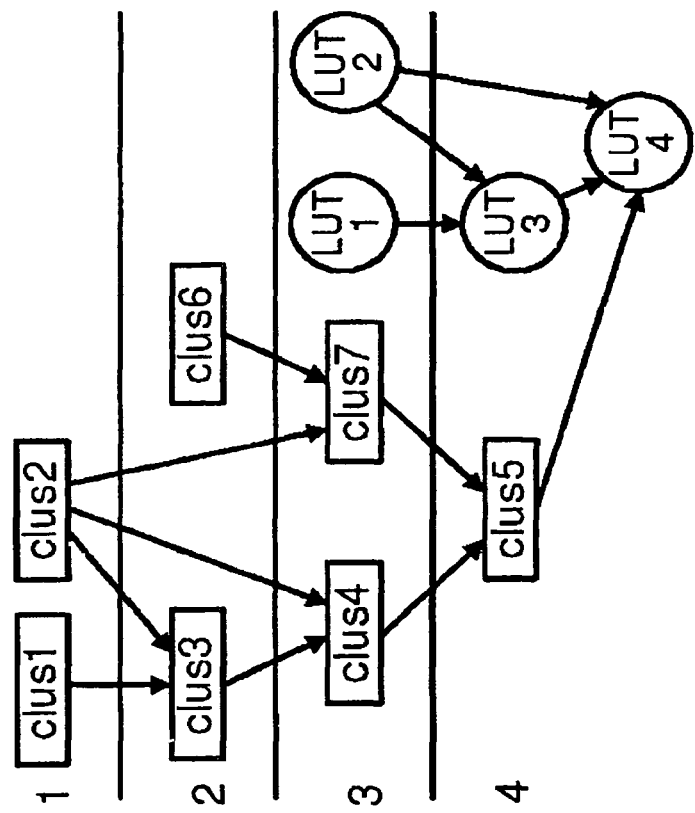
FIG. 21a illustrates an ASAP schedule, and FIG. 21b a ALAP schedule, for LUTs and LUT clusters in a plane, for distribution graph (DG) creation during a force-directed scheduling (FDS) implementation of the present invention.
Figure 21A:
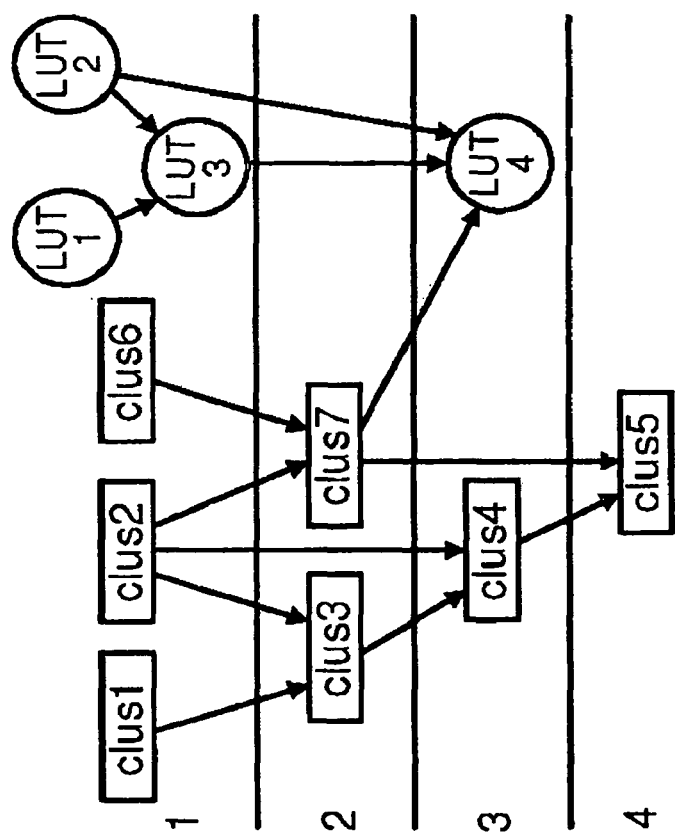
Figure 23B:
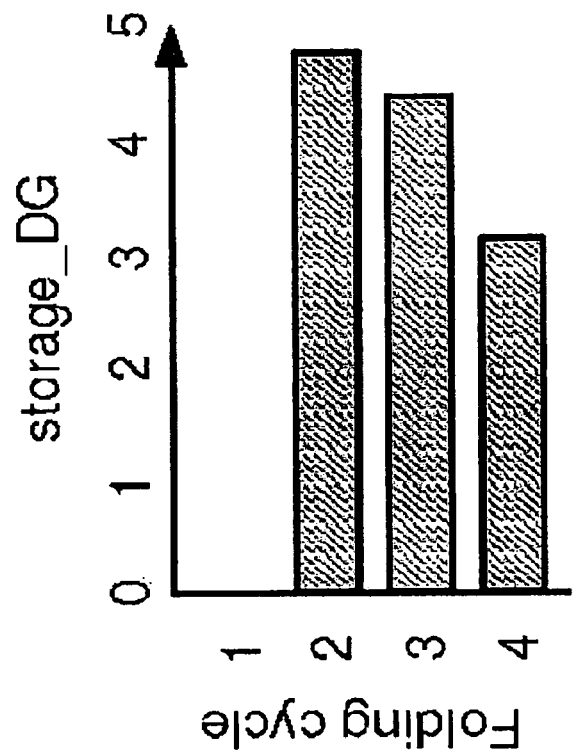
FIG. 23b illustrates a register storage DG for the ongoing example of FIG. 18, demonstrating a design optimization method and system of the present invention.
Figure 23A:
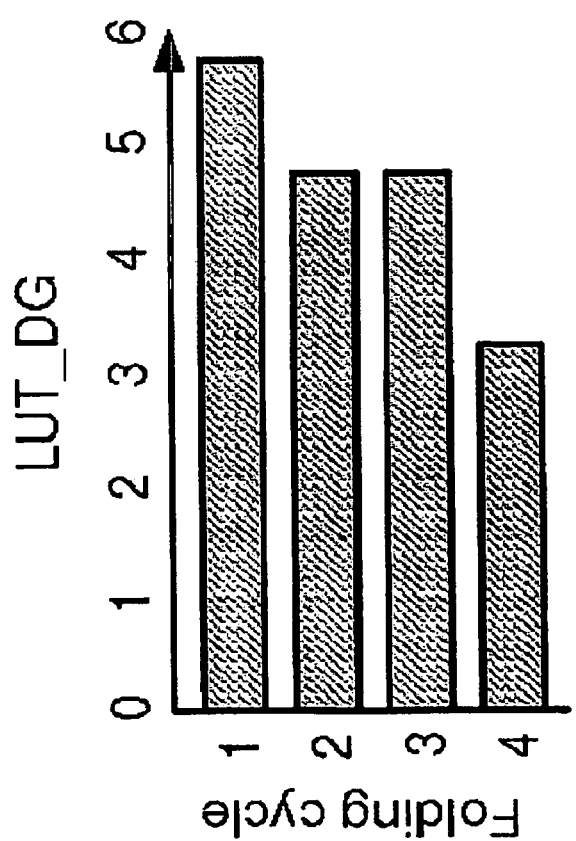
FIG. 23a illustrates a LUT computation Distribution Graph (DG)

The two DGs obtained for the example in FIG. 21 are shown in FIG. 23.

2) Calculation of Forces: In the FDS algorithm, force is used to model the impact of scheduling operations on resource use. A higher force implies higher concurrency of run-time operations, which requires more resources in parallel. The force is calculated based on DGs, which present the probability of resource usage concurrency. For a given computation with time frame spanning folding cycles a to b, the force in cycle j is calculated by:

force(j)=DG(j)*x(j)  (12)

where DG(j) is either LUT_DG(j) or storage_DG(j) in our case, and x(j) is the increase (or decrease) in the probability of computation in cycle j due to the scheduling of the computation. For example, before scheduling, the computation has a uniform probability of being scheduled in each folding cycle in its time frame. If in a scheduling attempt, the computation is scheduled in folding cycle α, the probability of the computation being scheduled in folding cycle a will increase to 1 and the probability of the computation being scheduled in other folding cycles will decrease to 0. The self-force associated with the assignment of a computation i, whose time frame spans folding cycles a to b, to folding cycle j is defined as the sum of all the resulting forces in each folding cycle in its time frame:

$$\text{self\_force}_i(j) = \sum_{k=a}^{b} \text{force}(k) = DG(j)*x(j) + \quad (13)$$

$$\sum_{k=a, k \neq j}^{b} |DG(k)*x(k)|, \; j \in [a, b]$$

$$x(j) = (|\text{time\_frame}_i| - 1)/|\text{time\_frame}_i|$$

$$x(k) = -1/|\text{time\_frame}_i|$$

In the approach of the present invention, the resource use can be dictated by either LUT computations or storage operations. Assume there are h LUTs and l flipflops in one LE, then the self-force for scheduling a LUT or LUT cluster i in folding cycle j is determined by $$\max\left\{\frac{\text{LUT\_self\_force}_i(j)}{h}, \frac{\text{storage\_self\_force}_i(j)}{l}\right\}$$

where LUT_self_force$_i$(j) and storage_self_jorce$_i$(j) are computed using Equation (13) based on the LUT computation and storage DGs.

Assigning a LUT computation to a specific folding cycle will often affect the time frame of its predecessors and successors, which in turn creates additional forces affecting the original move. Equation (13) is used to compute the force exerted by each predecessor or successor. The overall force is then the sum of the self-force and the forces of predecessors and successors. Then the total forces under each schedule for a computation are compared and the computation is scheduled into the folding cycle with the lowest force, which will result in the least concurrency.

3) Summary of the FDS algorithm: The pseudo-code of the proposed FDS technique is shown in Algorithm 1. Algorithm 1 uses an iterative approach to schedule one computation in each iteration. In each iteration, the LUT computation and register storage DGs are obtained. The LUT or LUT cluster with the minimum force is chosen, and assigned to the folding cycle with the minimum force. This procedure continues until all the LUT or LUT cluster computations are scheduled.

Algorithm 1—Force-Directed Scheduling (FDS)

```
1:  for LUT/(LUT cluster) computations to be scheduled do
2:      evaluate its time frame using ASAP and ALAP scheduling
3:      create the LUT computation distribution graph and storage
        operation distribution
        graph
4:      for each unscheduled LUT/(LUT cluster) computation i do
5:          for each feasible clock cycle j it can be assigned to do
6:              calculate the self-force of assigning node i to
                cycle j
7:              add predecessor and successor forces to self-
                forces to get the total force
                for node i in cycle j
8:          end for
9:          select the cycle with the lowest total force for node i
10:     end for
11:     Pick the node with the lowest total force and schedule it in the
        selected cycle
12: end for
```

Temporal Clustering

After scheduling, a network of LUTs is assigned to each folding stage. For each folding stage, we use a constructive algorithm to assign LUTs to LEs and pack LEs into MBs and SMBs. To construct each SMB, an unpacked LUT with the maximal number of inputs is first selected as an initial seed. Then, new LUTs with high attractions to the seed LUT are chosen and assigned to the SMB. The attraction between a LUT i and the seed LUT, Attraction$_{i,seed}$, depends on timing criticality and input pin sharing [17], as follows:

$$\text{Attraction}_{i,seed} = \alpha * \text{Criticality}_i + (1-\alpha) * \frac{\text{Nets}_{i,seed}}{G} \quad (15)$$

and as described in the following, which is incorporated herein by reference for its useful background information:

A. S. Marquardt, V. Betz, and J. Rose, "Using Cluster-Based Logic Blocks and Timing-Driven Packing to Improve FPGA Speed and Density," in *Proc. Int. Symp. FPGA*, February 1999, pp. 37-46.

In Equation 15, Criticality models the timing criticality of LUT i (e.g., the number of critical paths that this LUT is on), Nets$_{i,seed}$ is the number of shared I/Os between these two LUTs, and G is the number of I/Os per LE. $\alpha$ is a parameter that allows a tradeoff between timing criticality and interconnect demand.

Figure 24B:
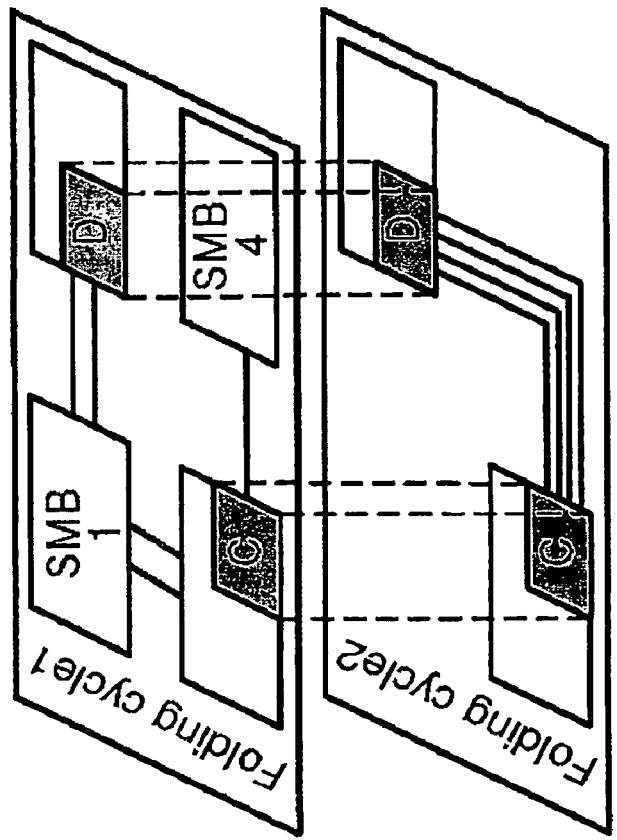
FIG. 24a illustrates clustering, and FIG. 24b placement, in an example of temporal logic folding in accordance with a design optimization method and system of the present invention.
Figure 24A:
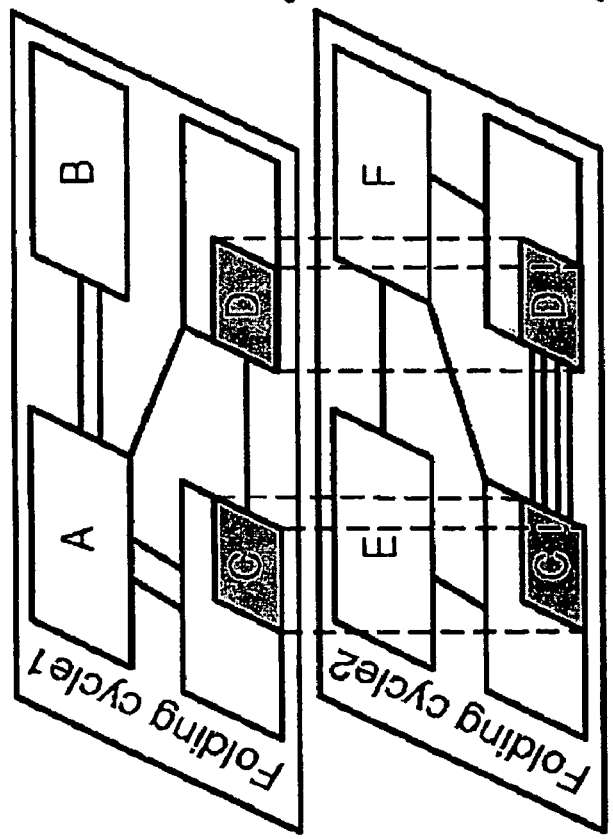

To support temporal logic folding, inter-folding stage resource sharing needs to be considered during clustering. Since due to logic folding, several folding stages may be mapped to a set of LEs, some of the LEs may be used to store the internal results and transfer them to another folding cycle. Such LEs may perform this job over several cycles and feed other LEs in each folding cycle. As illustrated in FIG. 24(a), in an earlier folding cycle, two LUTs may have very few attractions between them (C and D in FIG. 24(a)), but may have a large number of attractions in a later cycle. When performing temporal clustering, the attractions of two LUTs over all the cycles need to be accounted for. Thus, the attraction of such a LUT is set to the maximum of its attractions over all the cycles.

Placement and Routine

In the present invention, placement and routing is performed by a modified VPR. VPR refers to the techniques of the following, which is incorporated herein by reference for its useful background information:

V. Betz and J. Rose, "VPR: A New Packing, Placement and Routing Tool for FPGA Research," *Proc. Int. Wkshp. FPGA*, August 1997, pp. 213-222.

Placement uses a two-step simulated annealing approach. Placement starts with a fast low-precision placement. Routability analysis and delay estimation are then used to evaluate the quality of the initial placement. For routability analysis, a highly-efficient empirical estimation technique is used, as described in the following, which is incorporated herein by reference for its useful background information:

C. L. E. Chang, "VRISA: Accurate and Efficient Placement Routability Modeling," in *Proc. Int. Conf. Computer-Aided Design*, November 1994, pp. 690-695.

The routing demand for the interconnect resources for horizontal and vertical channels, $D_k^{i,horizontal}$ and $D_k^{i,vertical}$, each net k is estimated as:

$$D_k^{i,horisontal} = q * \frac{1}{Y}; \; D_k^{i,vertical} = q * \frac{1}{X} \quad (16)$$

where (X, Y) are the dimensions of the net bounding box for net k, and q is a pin-count dependent net-weight, as detailed in C. L. E. Chang. The sum of the demands of all the nets is then compared to the per-channel routing resources of NATURE to make sure the resources are adequate. Delay estimation is based on the timing analysis step of VPR. Routability analysis and delay estimation results are then used to evaluate the feasibility of the initial placement, which determines whether a high-precision placement or another round of logic folding should be invoked.

VPR placer was modified in the present invention to support temporal logic folding. Such temporal logic folding introduces inter-folding stage dependencies. Consider the example in FIG. 24(b). In folding cycle 1, since there are few connections between C and D, they may be placed far apart. However, such a placement would not be good for folding cycle 2 in which C and D communicate a lot. The Manhattan distance is computed between each pair of SMBs belonging to different temporal folding stages. The net bounding box in other unplaced cycles are estimated using this Manhattan distance and added to the cost function for the current cycle to guide placement. Routing is conducted in a hierarchical fashion, first using length-1, then length-4 and finally global interconnects (i.e., the three types of interconnects in NATURE, above). Note that a length-i interconnect spans i SMBs.

Experimental Results—An instance of NATURE using NanoMap

Presented here are experimental results for the mapping of seven RTL/gate-level benchmarks to an instance of NATURE using NanoMap to illustrate the benefits of run-time reconfiguration and logic folding. NATURE is a family of architectures, which may vary in the number of inputs and registers in an LE, number of LEs in an MB, number of MBs in an SMB, etc. In this experimental instance, an architecture having one four-input LUT in an LE, four LEs in an MB, and four MBs in an SMB, are selected to obtain good area-delay tradeoffs. Observations show that temporal logic folding greatly reduces the area for implementing logic, so much so that the number of registers in the design becomes the bottleneck for area reduction. Thus, as opposed to traditional LEs that include only one register, the present invention, in this example, includes two registers per LE, which increases an SMB's area to 1.5× (all experiments are based on a 100 nm technology). However, the LE area increase is more than offset by the significant reduction in overall area. To fully explore the potential of logic folding, we assume that a varying number of reconfiguration sets, k, is available in carbon nanotube RAMs depending on the application. We also show the tradeoffs when the size of carbon nanotube RAM is instead fixed to 16.

Among the seven benchmarks targeted, ex1 is the circuit shown in FIG. 18, but with a bit-width of 16. Paulin is a differential-equation solver, and FIR and Biquad are two types of digital filters. ASPP4 is an application-specific programmable processor. c5315 is a gate-level ALU implementation from the ISCAS'85 benchmark suite. NanoMap was run on a 2 GHz PC with 1 GB of DRAM under RedHat Linux 9. The mapping CPU times were less than a minute for all the benchmarks.

First, all benchmarks were mapped under the area-time (AT) product minimization objective to show the logic density benefits of temporal logic folding against the traditional no-folding case. Table II of FIG. 25 shows the mapping results. The first five columns describe the benchmark name and structure. Columns 6 and 7 of Table II of FIG. 25 show the number of LEs required and circuit delay for the no-folding case. Columns 8 and 12 show the best folding level established by the present invention, NanoMap, for AT product optimization without and with limitations on k. AT product optimization is achieved with folding level-1 in all the cases when there is no restriction on k, since an increase in circuit delay is more than overcome by the dramatic reduction in area when using level-1 folding.

The corresponding area (where the number of LEs is used as a proxy for area due to the regular architecture), circuit delay and AT product improvement with respect to the no-folding case for examples without and with limitations on k are shown in Table II—Columns 9-11 and 13-15, respectively. The average reduction in the number of LEs is 14.8× (9.2×) and in the AT product 11.0×(7.8×), at the price of a 31.8% (19.4%) increase in circuit delay for large enough k (with k limited to 16).

Accordingly, the present invention can target many different optimization objectives: (i) minimization of circuit delay with or without an area constraint; (ii) minimization of area with or without a delay constraint; (iii) minimization of the AT product; and (iv) finding a feasible implementation under both area and delay constraints.

Different optimization objectives for different benchmarks are selected, with results presented in Table III. Objectives are noted in Column 2 of Table III of FIG. 25, and the constraint (i.e., area or delay) is noted in Columns 3 and 4 of Table III. Table III of FIG. 25 illustrates the versatility of NATURE and NanoMap. Further, a significant side-benefit of area reductions made possible by logic folding is the associated reduction for a deep interconnection hierarchy in NATURE. Since cycle-by-cycle reconfiguration makes LE utilization very high, the need for global communication greatly reduces. Global interconnect use was reduced by more than 50% when using level-1 folding as opposed to no-folding, due to trading interconnect area for increased carbon nanotube RAM area in NATURE.

Conclusion

The present invention presents a hybrid nanotube/CMOS dynamically reconfigurable architecture, NATURE, and an RTL/gate-level automatic design optimization flow, NanoMap, for the NATURE reconfigurable architecture. NATURE supports run-time fine-grain reconfiguration and, hence, enables temporal logic folding. Through logic folding, significant logic density improvement and flexibility in performing area-delay tradeoffs are possible.

NanoMap incorporates temporal logic folding during the logic mapping, temporal clustering and placement steps. NanoMap provides for automatic selection of a best folding level, and uses force-direct scheduling to balance resources across the different folding stages. Mapping, as provided by the present invention, can target various optimization objectives and user constraints. With NanoMap, the potential of NATURE can be effectively realized.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention.

What is claimed:

1. A method of run-time reconfiguration, comprising the steps of:

writing reconfiguration bits into a first storage on a chip at a time of initial configuration; and placing said reconfiguration bits into a second storage on the chip during run-time reconfiguration to configure one or more logic elements (LEs) and one or more switches to implement different logic functionalities and interconnections.

2. The method of claim 1, wherein reconfiguration commences at one edge of a clock signal, followed by computation at another edge of the clock signal.

3. The method of claim 1, comprising:
computing an ouput from at least one logic function implemented by at least one of the one or more LEs and at least one of the one or more switches; and
using the output for additional computation or storing the output for use by additional computation.

4. The method of claim 3, wherein the at least one logic function, implemented by the at least one of the one or more LEs and at least one of the one or more switches, comprises a mapped configuration of the at least one of the one or more LEs, the at least one of the one or more switches, and one or more outputs.

5. The method of claim 3, wherein the output is provided as input to at least one of the one or more LEs.

6. The method of claim 1, wherein the one or more logic elements further comprise one or more look-up tables (LUTs).

7. The method of claim 6, further comprising electrically coupling a LUT output storage to the one or more LUTs.

8. The method of claim 1, wherein the one or more LEs further comprise a flip-flop.

9. The method of claim 3, wherein at least one LE is configured to implement a m-variable Boolean function.

10. The method of claim 1, wherein the first storage comprises carbon nanotube memory cells.

11. The method of claim 1, wherein the first storage comprises phase change memory cells.

12. The method of claim 1, wherein the first storage comprises magnoresistive memory cells.

13. The method of claim 1, wherein the first storage comprises ferroelectric memory cells.

14. The method of claim 1, wherein the second storage comprises a static random access memory (SRAM).

15. The method of claim 1, further comprising:
loading a first group of reconfiguration bits, from said reconfiguration bits stored in the first storage, in a first portion of the second storage; and
utilizing a second portion of the second storage to perform computation.

16. A method of run-time reconfiguration, comprising the steps of:
writing reconfiguration bits into a first storage on a chip at a time of initial configuration; and
placing one or more of said reconfiguration bits into a second storage on the chip during run-time reconfiguration to configure one or more logic elements (LEs) and one or more switches to implement different logic functions.

17. The method of claim 16, wherein reconfiguration commences at one edge of a clock signal, followed by computation at another edge of the clock signal.

18. The method of claim 16, comprising:
computing an output from at least one logic function implemented by at least one of the one or more LEs and at least one of the one or more switches; and
using the output for additional computation or storing the output for use by additional computation.

19. The method of claim 18, wherein the at least one logic function, implemented by the at least one of the one or more LEs and at least one of the one or more switches, comprises a mapped configuration of the at least one of the one or more LEs, the at least one of the one or more switches, and one or more outputs.

20. The method of claim 18, wherein the output is provided as input to at least one of the one or more LEs.

21. The method of claim 16, wherein the one or more logic elements further comprise one or more look-up tables (LUTs).

22. The method of claim 21, further comprising electrically coupling a LUT output storage to the one or more LUTs.

23. The method of claim 16, wherein the one or more LEs further comprise a flip-flop.

24. The method of claim 18, wherein at least one LE is configured to implement a m-variable Boolean function.

25. The method of claim 16, wherein the first storage comprises carbon nanotube memory cells.

26. The method of claim 16, wherein the first storage comprises phase change memory cells.

27. The method of claim 16, wherein the first storage comprises magnoresistive memory cells.

28. The method of claim 16, wherein the first storage comprises ferroelectric memory cells.

29. The method of claim 16, wherein the second storage comprises a static random access memory (SRAM).

30. The method of claim 16, further comprising:
wherein placing one or more of said reconfiguration bits into the second storage on the chip during run-time reconfiguration comprises placing the one or more of said reconfiguration bits into a first portion of the second storage; and
utilizing a second portion of the second storage to perform a computation.

* * * * *

UNITED STATES PATENT AND TRADEMARK OFFICE
CERTIFICATE OF CORRECTION

| | |
|---|---|
| PATENT NO. | : 8,117,436 B2 |
| APPLICATION NO. | : 12/297638 |
| DATED | : February 14, 2012 |
| INVENTOR(S) | : Wei Zhang, Niraj K. Jha and Li Shang |

It is certified that error appears in the above-identified patent and that said Letters Patent is hereby corrected as shown below:

Column 27, Claim 1, Lines 2-3
Replace "functionalities and interconnections" with --functions--

Column 27, Claim 15, Lines 45-46
Replace "perform computation" with --perform a computation--

Signed and Sealed this
Fifth Day of June, 2012

David J. Kappos
*Director of the United States Patent and Trademark Office*